(12) United States Patent
Sasaki et al.

(10) Patent No.: US 9,324,572 B2
(45) Date of Patent: Apr. 26, 2016

(54) PLASMA ETCHING METHOD, METHOD FOR PRODUCING SEMICONDUCTOR DEVICE, AND PLASMA ETCHING DEVICE

(75) Inventors: Masaru Sasaki, Seidai (JP); Kazuki Moyama, Amagasaki (JP); Masaki Inoue, Seidai (JP); Yoko Noto, Seidai (JP)

(73) Assignee: TOKYO ELECTRON LIMITED (JP)

( * ) Notice: Subject to any disclaimer, the term of this patent is extended or adjusted under 35 U.S.C. 154(b) by 0 days.

(21) Appl. No.: 13/582,523

(22) PCT Filed: Mar. 3, 2011

(86) PCT No.: PCT/JP2011/054961
§ 371 (c)(1),
(2), (4) Date: Oct. 8, 2012

(87) PCT Pub. No.: WO2011/108663
PCT Pub. Date: Sep. 9, 2011

(65) Prior Publication Data
US 2013/0029494 A1 Jan. 31, 2013

(30) Foreign Application Priority Data
Mar. 4, 2010 (JP) .................. 2010-048450

(51) Int. Cl.
*H01L 21/461* (2006.01)
*H01L 21/311* (2006.01)
(Continued)

(52) U.S. Cl.
CPC ..... *H01L 21/31116* (2013.01); *H01J 37/32192* (2013.01); *H01J 37/32238* (2013.01);
(Continued)

(58) Field of Classification Search
None
See application file for complete search history.

(56) References Cited

U.S. PATENT DOCUMENTS 4,412,885 A * 11/1983 Wang et al. .................. 438/713
6,635,185 B2 * 10/2003 Demmin et al. ............. 216/64
(Continued)

FOREIGN PATENT DOCUMENTS

JP 06104190 4/1994
JP 06168920 6/1994
(Continued)

OTHER PUBLICATIONS

Helmenstine, Fluoridated Hydrocarbon Definition, Nov. 7, 2014, About Education.*
(Continued)

*Primary Examiner* — Binh X Tran
*Assistant Examiner* — David Cathey, Jr.
(74) *Attorney, Agent, or Firm* — Cantor Colburn LLP

(57) ABSTRACT

Provided is a plasma etching method increasing the selectivity of a silicon nitride film in relation to the silicon oxide film or silicon functioning as a base. In a plasma etching method setting a pressure in a processing container as a predetermined level by exhausting a processing gas while supplying the processing gas into the processing container, generating plasma by supplying external energy to the processing container, and setting a bias applied to a holding stage holding a substrate in the processing container as predetermined value to selectively etch the silicon nitride film with respect to a silicon and/or silicon oxide film, the processing gas includes a plasma excitation gas, a CHxFy gas, and at least one oxidizing gas selected from the group consisting of $O_2$, $CO_2$, $CO$, and a flow rate of the oxidizing gas with respect to the CHxFy gas is set to be 4/9 or greater.

4 Claims, 33 Drawing Sheets

(51) Int. Cl.
  *H01J 37/32* (2006.01)
  *H01L 29/66* (2006.01)
  *H01L 29/78* (2006.01)

(52) U.S. Cl.
  CPC ........ *H01L29/6653* (2013.01); *H01L 29/6659* (2013.01); *H01L 29/66795* (2013.01); *H01L 29/7833* (2013.01)

(56) References Cited

U.S. PATENT DOCUMENTS

| | | | |
|---|---|---|---|
| 6,730,587 B1 * | 5/2004 | Bertrand et al. | 438/592 |
| 2006/0157449 A1 * | 7/2006 | Takahashi et al. | 216/67 |
| 2009/0311870 A1 * | 12/2009 | Sasaki | 438/719 |
| 2010/0321029 A1 * | 12/2010 | Ito et al. | 324/464 |

FOREIGN PATENT DOCUMENTS

| | | |
|---|---|---|
| JP | 11214355 | 8/1999 |
| JP | 2002289841 | 10/2002 |
| JP | 2003229418 | 8/2003 |
| JP | 2006165030 | 6/2006 |
| JP | 2008078209 | 4/2008 |
| JP | 2008243942 | 10/2008 |
| JP | 2009026795 | 2/2009 |
| JP | 2009302181 | 12/2009 |
| KR | 1020030027505 | 4/2003 |
| KR | 100405578 | 11/2003 |
| WO | 9816950 | 4/1998 |

OTHER PUBLICATIONS

Sugawara, Plasma Etching Fundamentals and Applications, 2002, Oxfor University Press, 3.1.1 Etching rate and etching uniformity paragraphs 1 and 2.*
Nishi et al, Handbook of semiconductor manufacturing technology, Marcel Dekker, cover, ISBN page, 1 paragraph of I. Plasmas, Reagents, and Reactions, of chapter 21 Plasma Etching.*
Quirk et al, Semiconductor manufacturing technology, Prentice Hall, cover, Fig. 16.8, Fig. 16.25.*
International Search Report—PCT/JP2011/054961 dated May 24, 2011.
Japanese Office Action—Japanese Application No. 2012-503261, issued on Aug. 27, 2013.
Japanese Office Action—Japanese Application No. 2013-223110, issued on Aug. 26, 2014.
Korean Office Action—Korean Application No. 10-2012-7023123, issued on Oct. 23, 2013.
Korean Office Action—Korean Application No. 10-2012-7023123, issued on Apr. 28, 2014.

* cited by examiner

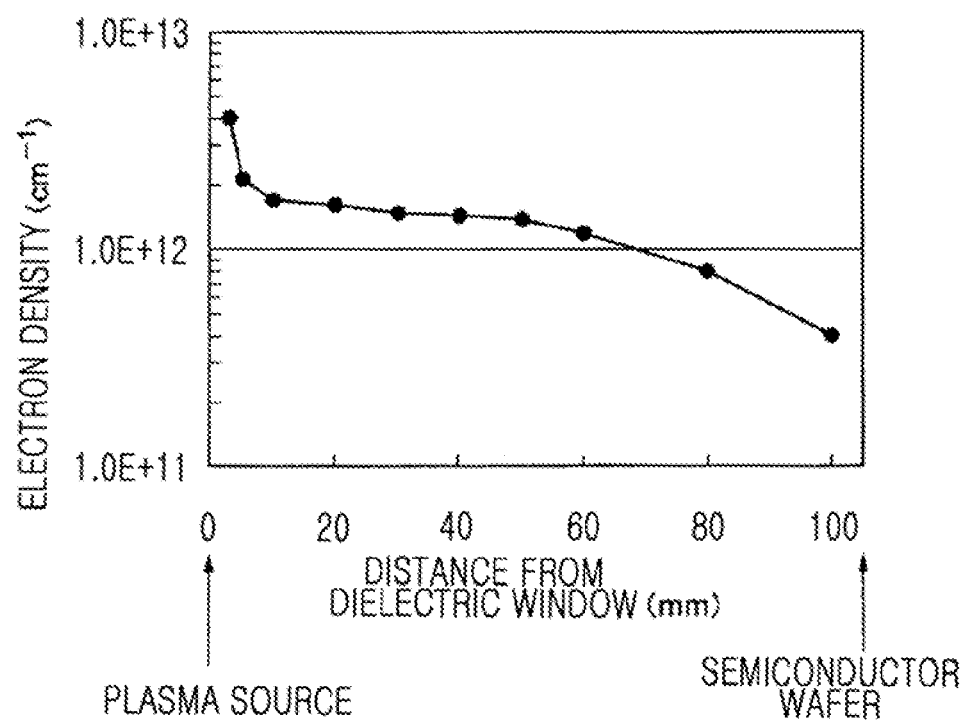

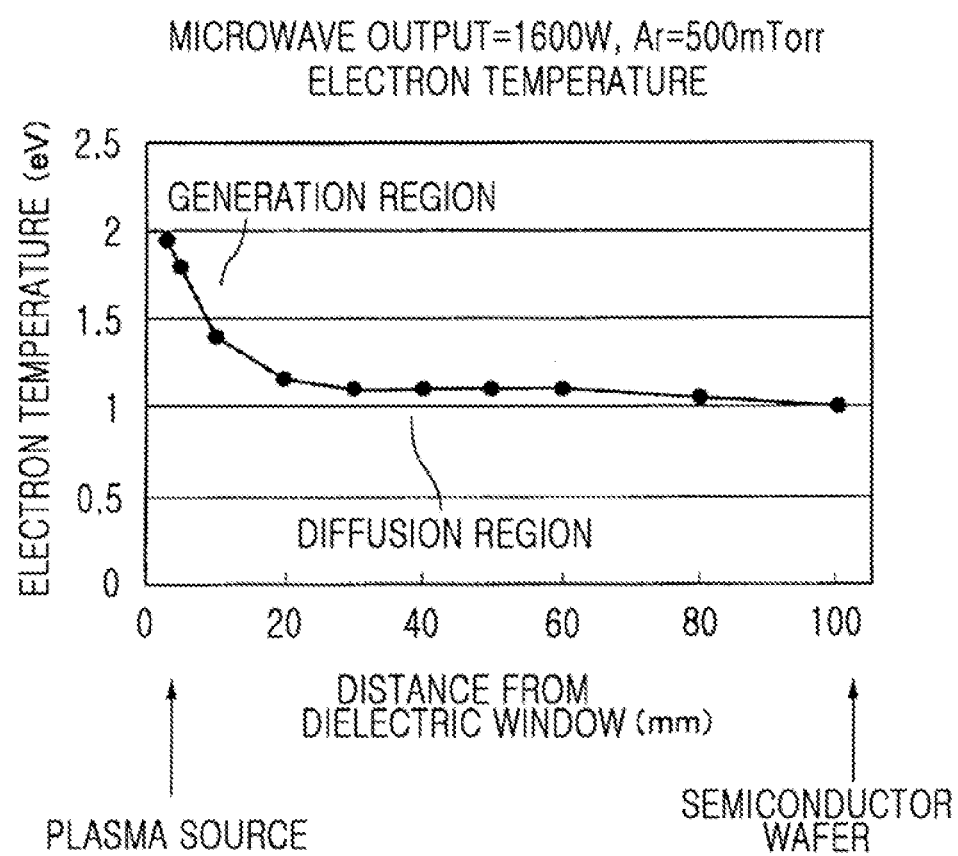

FIG. 6
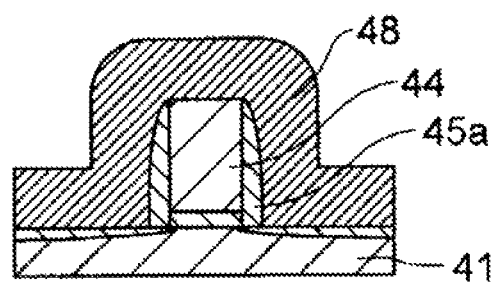
⇩ ANISOTROPIC ETCHING
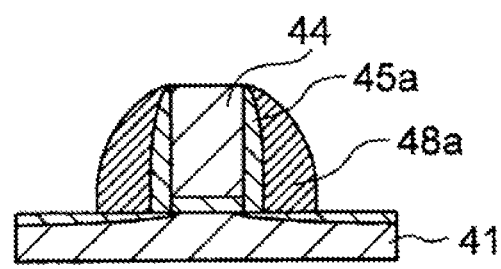

FIG. 12

| x1000K | Initial | ME | 100mT Ar/CHxFy/O₂ 50% OE |
|---|---|---|---|
| Bottom SiN (nm) | 6.0nm | 0 | 0 |
| RECESS | (1.4nm) | Δ0.4nm(1.8nm) | Δ0.7nm(2.1nm) |

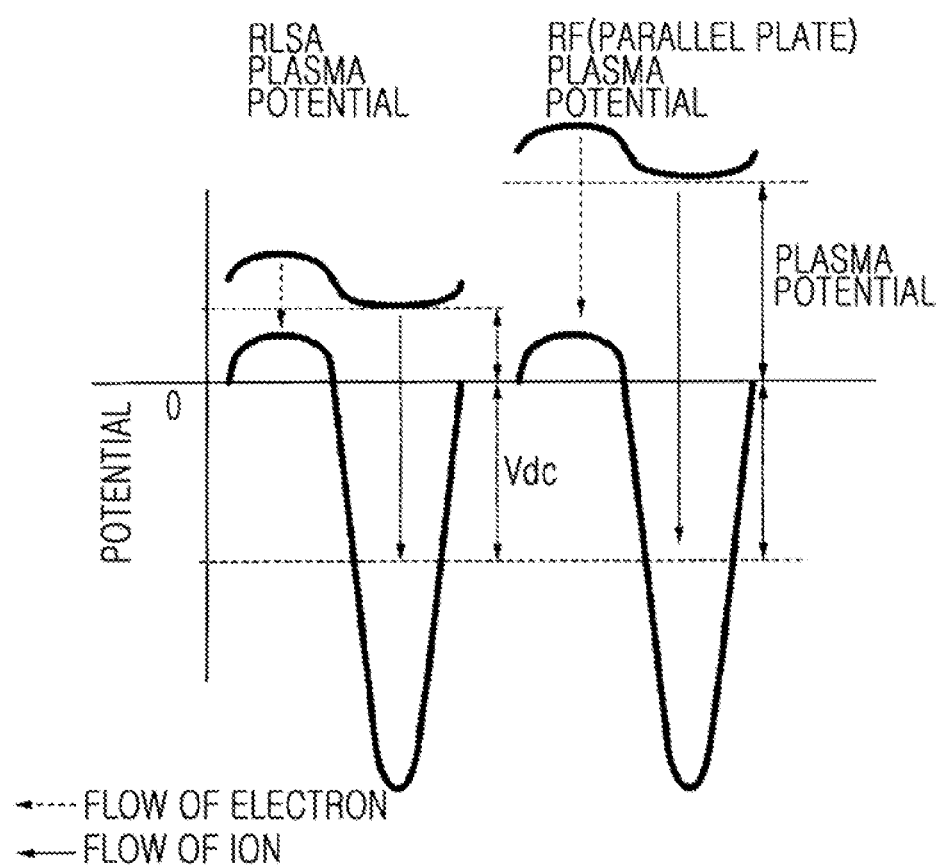

PLASMA ETCHING METHOD, METHOD FOR PRODUCING SEMICONDUCTOR DEVICE, AND PLASMA ETCHING DEVICE

This application claims the benefit of Japanese Patent Application No. 2010-048450, filed on Mar. 4, 2010, in the Japanese Patent Office, the disclosure of which is incorporated herein in its entirety by reference.

TECHNICAL FIELD

The present invention relates to a plasma etching method using plasma, a method for producing a semiconductor device, and a plasma etching device.

BACKGROUND ART

In view of large scale integration (LSI), four-time integration has been made at every two or three years, and is expected to be continued later. Plasma etching technology is an important base technology in forming fine patterns of a semiconductor, with a lithography technology. A basic mechanism of a plasma etching process includes adhesion of radicals generated by plasma generation to a film to be etched, and an ion assist etching reaction occurring due to ion implantation by an RF. So far, a parallel plate type, an electron cyclotron resonance (ECR) type, and an inductively coupled plasma (ICP) type have been used as a plasma source.

As a plasma etching method, a silicon nitride film on a silicon substrate or a silicon oxide film may be etched. In this case, it is necessary to increase selectivity of the silicon nitride film with respect to the silicon substrate or the silicon oxide film functioning as a base. Selectivity is a ratio between an etching rate of the silicon nitride film that is to be etched and an etching rate of a base film that is not etched, and the greater the selectivity is, the better.

The etching method in which the selectivity of the silicon nitride film with respect to the silicon substrate or the silicon oxide film is increased may be used in a method for producing, for example, a metal oxide semiconductor (MOS) transistor. An example of the method for producing the MOS transistor is as below.

FIGS. 24A through 24E show an example of a method for producing a MOS transistor. A large-scale LSI mostly uses a MOS transistor as a transistor. When forming a fine MOS transistor, a so-called "shallow junction" that forms a shallow p-n junction depth is necessary on a source and a drain of the MOS transistor. In order to realize the "shallow junction", extension regions are formed on the source and the drain of the MOS transistor (for example, refer to Patent Reference 1).

First, as shown in FIG. 24A, a silicon oxide film 102 is formed on a silicon substrate 101. Next, a polysilicon film is deposited on the substrate, and then, the polysilicon is patterned by using a lithography technology and a dry etching process to form a gate electrode 103.

Next, in the process shown in FIG. 24B, a silicon oxide film 104 is deposited on the substrate by using a chemical vapor deposition (CVD) method. In addition, as shown in FIG. 24C, the silicon oxide film 104 is etched back to form offset spacers 104a on side surfaces of the gate electrode 103, and at the same time, a gate insulating layer 102a is formed under the gate electrode 103. In addition, ion implantation is performed by using the gate electrode 103 and the offset spacers 104a as a mask to form extension regions 108 on opposite side portions of the gate electrode 103 in the silicon substrate 101.

Next, in the process shown in FIG. 24D, an insulating layer such as a silicon oxide film is deposited on the substrate and etched back to form side wall spacers 109 formed of the silicon oxide film on outer portions of the offset spacers 104a. After that, ion implantation is performed by using the gate electrode 103, the offset spacers 104a, and the side wall spacers 109a as a mask to form high concentration source/drain regions 107 on outer portions of the extension regions 108 in the silicon substrate 101.

Then, in the process shown in FIG. 24E, after depositing a metal film such as a cobalt film or a nickel film on the substrate, and then, the silicon surface on which an upper portion of the gate electrode 103 and the high concentration source/drain regions 107 are exposed and the cobalt, the nickel, or the like react with each other to form, through self-alignment, a silicide film 110 for realizing low resistance on the surface on which the upper portion of the gate electrode 103 and the high concentration source/drain regions 107 are exposed.

When etching the fine gate electrode 103, plasma is generated in a processing container and an RF is applied to a holding stage on which the substrate is placed in the processing container, and then, ion is introduced on the substrate to perform a dry etching of the gate electrode 103.

In the process shown in FIG. 24D, when the side wall spacers 109 are formed on side walls of the gate electrode 103, a process of etching the silicon nitride film on the source/drain regions and the gate electrode 103 may be necessary. In this case, an etching operation with high selectivity of the silicon nitride film with respect to the silicon substrate or the silicon oxide film that is a base is necessary.

In addition, since the side wall spacers 109 are required to have an intensity that can bear the ion implantation, the silicon nitride film may be used as the side wall spacers 109. In addition, in the process shown in FIG. 24E, an etching for removing the side wall spacers 109 that are formed of the silicon nitride film used as a mask during the ion implantation is necessary. That is, an etching for selectively removing the side wall spacers 109 formed of the silicon nitride film with respect to the offset spacers 104a formed of the silicon oxide film is necessary.

PRIOR ART REFERENCE

Patent Reference (Patent Reference 1) Japanese Laid-open Patent Publication No. 2002-289841

DISCLOSURE OF THE INVENTION

Technical Problem

The present invention provides a plasma etching method capable of improving selectivity of a silicon nitride film with respect to a silicon substrate or a silicon oxide film that is a base and accordingly preventing the base from being damaged (recess), a method for producing a semiconductor device, and a plasma etching device.

Technical Solution

According to an aspect of the present invention, there is provided a plasma etching method including: setting a pressure in a processing container as a predetermined value by supplying a processing gas into the processing container while exhausting the processing gas; generating plasma by supplying external energy to the processing gas; setting a bias applied to a holding stage, on which a substrate is placed, in the processing container to be a predetermined value so that a silicon nitride film may be selectively etched with respect to silicon and/or a silicon oxide film, wherein the processing gas may include a plasma excitation gas, a CHxFy gas, wherein x and y are 1 or greater integers, and at least one oxidizing gas selected from the group consisting of $O_2$, $CO_2$, and CO, and a flow rate of the oxidizing gas with respect to the CHxFy gas may be set to be 4/9 or greater when $O_2$ or $CO_2$ is used as the oxidizing gas, 8/9 or greater when CO is used as the oxidizing gas, and 4/9 or greater in a converted flow rate to $O_2$ when at least two of $O_2$, $CO_2$, and CO are mixed to be used as the oxidizing gas.

According to another aspect of the present invention, there is provided a plasma etching method for selectively etching a silicon nitride film, the plasma etching method including: setting a pressure in a processing container to be 40.0 Pa (300 mTorr) or greater by supplying the processing gas for performing an etching process in the processing container while exhausting the processing gas; generating plasma in the processing container by introducing a microwave in the processing container via a dielectric window formed on an upper portion of the processing container; and selectively etching the silicon nitride film in a non-bias state where a radio frequency (RF) is not applied to a holding stage where a substrate is placed in the processing container.

Advantageous Effects

According to an aspect of the present invention, since an oxidizing gas is excessively supplied to be greater than an amount required to remove CF-based deposits, and thus, a surface of a silicon substrate is etched while being oxidized, thereby forming a $SiO_2$ film on the surface of the silicon. Since bond energies are in a relation of Si—O>Si—N>Si—Si, when the $SiO_2$ film is formed on the surface of the silicon substrate, the surface of the silicon substrate is hardened, thereby reducing an etching rate of the silicon. Meanwhile, although the silicon nitride film is also oxidized like the silicon substrate, an etching rate of the silicon nitride film is not reduced as much as that of the silicon, thereby increasing selectivity of the silicon nitride film with respect to the silicon.

Also, by supplying the oxidizing gas excessively more than an amount required to remove the CF-based deposits, an etching rate of the silicon oxide film that is already in an oxidation state is reduced. Therefore, selectivity of the silicon nitride film with respect to the silicon oxide film is increased.

According to another aspect of the present invention, since a pressure in a processing container is set to be high pressure of 40.0 Pa (300 mTorr) or greater and an RF bias applied to a holding stage is 0 (RF bias is not applied), an isotropic etching of the silicon nitride film can be performed. Ion energy applied to the substrate is correlated with a sum of a plasma potential energy and a bias applied to the substrate. Since the RF bias is nearly 0, the etching may be performed only by using the plasma potential energy. Since the plasma potential energy is also reduced by using microwave plasma, the silicon nitride film may be etched without generating damage.

BRIEF DESCRIPTION OF THE DRAWINGS

FIG. 3 is a graph showing a relationship between a distance from a dielectric window and an electron density in the RLSA etching apparatus;

FIG. 4 is a graph showing a relationship between a distance from a dielectric window and an electron temperature in the RLSA etching apparatus;

FIG. 6 is a cross-sectional view of a MOS transistor in which side wall spacers are isotropically etched;

FIGS. 7A and 7B are schematic diagrams showing a damage and a footing occurring in a silicon substrate, wherein FIG. 7A shows a damage and FIG. 7B shows a putting;

FIGS. 9A and 9B are diagrams showing etching processes of the MOS transistor, wherein FIG. 9A shows an anisotropic etching and FIG. 9B shows an isotropic etching;

FIG. 12 is a photograph showing an observing result of a recess;

FIGS. 14A through 14C are graphs showing a parameter dependency of an etching rate, wherein FIG. 14A shows an $O_2$ flow dependency, FIG. 14B shows a microwave power dependency, and FIG. 14C shows an RF power dependency;

FIGS. 17A and 17B are graphs showing an oxidation state of a silicon nitride film, wherein FIG. 17A shows a relationship between a depth and an oxygen concentration, and FIG. 17B shows a relationship between an $O_2$ concentration of the surface and an etching rate;

FIG. 20 is a schematic diagram comparing ion energies of an RLSA etching apparatus and a parallel plate type etching apparatus;

FIGS. 21A through 21C are graphs comparing plasma potentials in an etching apparatus using an RLSA as a plasma source and an etching apparatus using a parallel plate as a plasma source, wherein FIG. 21A is a graph varying a microwave power, FIG. 21B is a graph varying a pressure, and FIG. 21C is a graph varying an RF power;

BEST MODE FOR CARRYING OUT THE INVENTION

Hereinafter, a plasma etching method according to a first embodiment and a second embodiment of the present invention will be described with reference to accompanying drawings. The plasma etching method according to the first and second embodiments is performed in etching apparatuses having the same configurations as each other. A radial line slot antenna (RLSA) etching apparatus generating microwave plasma by using an RLSA is used as the etching apparatus.

Figure 1:
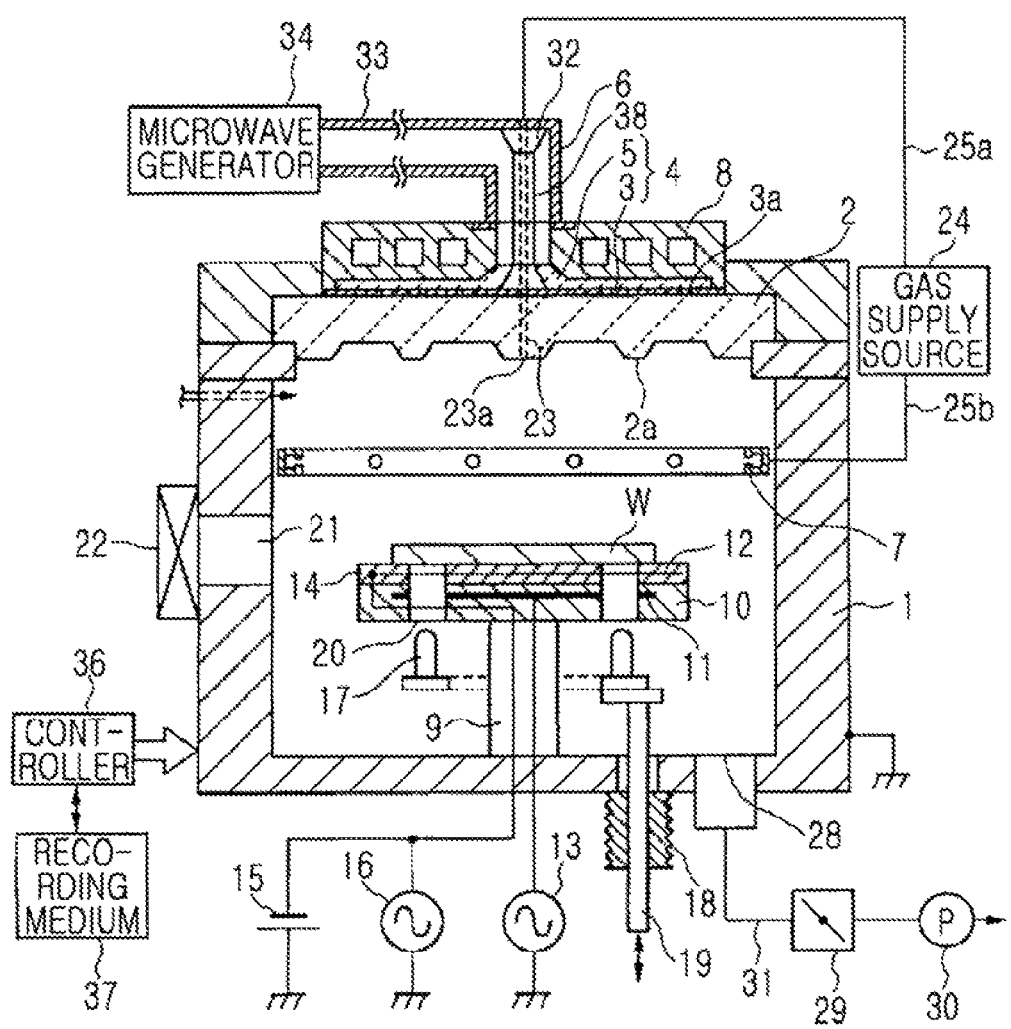
FIG. 1 is a block diagram showing an entire radial line slot antenna (RLSA) etching apparatus according to an embodiment of the present invention.

FIG. 1 is a block diagram of an RLSA etching apparatus. The RLSA etching apparatus uses a microwave as a plasma source. As such, plasma having a low electron temperature and high density may be generated in a region where an etching process is performed. Each component in the RLSA etching apparatus has following configuration.

The RLSA etching apparatus includes a processing container 1 formed of an aluminum alloy or the like as a cylinder. The processing container 1 is grounded. A holding stage 10 stood by a pillar 9 is provided on a center portion of a bottom of the processing container 1. A semiconductor wafer W is held on an upper surface of the holding stage 10. The holding stage 10 may be formed of a ceramic material, for example, alumina, alumina nitride, or the like. A resistive heater 11 is buried in an approximately entire region of the holding stage 10 to heat the semiconductor wafer W to a predetermined temperature and maintain the temperature. The resistive heater 11 is connected to a heater power source 13 via wires disposed in the pillar 9. A cooling medium passage (not shown) is provided in the holding stage 10. The cooling medium passage is formed as a circular loop. The semiconductor wafer W can be cooled down to a predetermined temperature by circulating a cooling medium supplied from a chiller unit through the cooling medium passage.

An electrostatic chuck 14 including conductive lines 12 prepared as a fishnet therein is provided on the upper surface of the holding stage 10 and has a thin plate shape. A DC power source 15 is connected to the conductive line 12, and the electrostatic chuck 14 electrostatically absorbs the semiconductor wafer W placed on the holding stage 10 by using a DC voltage applied from the DC power source 15. An RF power source 16 for bias is connected to the conductive line 12 in the electrostatic chuck 14 as a bias application unit for applying an RF power for bias of 13.56 MHz via, for example, a matcher (not shown). The matcher matches an output impedance of the RF power source 16 for bias with an impedance of loads including the holding stage 10, the plasma generated in the processing container 1, and the processing container 1. The matcher includes a blocking condenser for generating a self-bias. A frequency of the RF power supplied from the RF power source 16 for bias is not limited to 13.56 MHz, but may be another RF frequency, for example, 27 MHz.

A plurality of elevating pins 17 for elevating the holding stage 10 when carrying in/carrying out the semiconductor waver W are provided under the holding stage 10. The elevating pins 17 are elevated by an elevating rod 19 that is provided while penetrating through the bottom portion of the processing container 1 via an extendable bellows 18. Insertion through holes 20, through which the elevation pins 17 may be inserted to penetrate, are formed in the holding stage 10.

An inlet/outlet 21 for carrying in/carrying out the semiconductor wafer W is provided in a peripheral wall of the processing container 1. A gate valve 22 for opening/closing the inlet/outlet 21 while maintaining a sealing state of the processing container 1 is provided on the inlet/outlet 21.

A center gas introduction path 23 for supplying a processing gas into the processing container 1 is provided on a center of a dielectric window 2 formed on a ceiling portion of the processing container 1. The center gas introduction path 23 is provided so as to penetrate through an internal conductor of a coaxial tube 38. An injection hole 23a opening toward the processing container 1 is formed on a center portion of the dielectric window 2. The center gas introduction path 23 is connected to a gas supply source 24 via a gas passage 25a. A mass flow controller (MFC) controlling flow of each gas and a valve performing turning on/turning off are provided in the gas passage 25a so as to supply each of the processing gas to the gas passage 25 while controlling a flow rate of the gas. The processing gas from the gas supply source 24 flows through the gas passage 25a and the center gas introduction path 23, and then is injected toward the holding stage 10 located below from the injection hole 23a. Since the processing gas is attracted toward an exhaust path that is formed as a circular loop surrounding the holding stage 10 by a vacuum pump 30, the processing gas injected toward the semiconductor wafer W is dispersed in the processing container to an outer portion of a radial direction.

Also, a gas ring 7 for supplying the processing gas is provided below the injection holes 23a and above the semiconductor wafer W. The gas ring 7 and the center gas introduction path 23 configure a processing gas supply unit. The gas ring 7 is formed as a ring having a hollow center portion, and includes a plurality of side injection holes in an inner circumferential side surface at constant intervals in a circumferential direction. The plurality of side injection holes are opened in a plasma region in the processing container 1. The gas ring 7 is connected to the gas supply source 24 via a gas passage 25b. An MFC controlling a flow rate of each of the processing gas and a valve performing turning on/off are provided in the gas passage 25b to supply each of the processing gas to the gas ring 7 while controlling the flow rate of the each processing gas. The processing gas from the gas supply source 24 is introduced to the gas ring 7 via the gas passage 25b. An internal pressure of the gas ring 7 becomes uniform in a circumferential direction when the processing gas is filled in the gas ring 7, and the processing gas can be injected evenly from the plurality of side injection holes toward an inner portion of the radial direction of the gas ring 7 in the processing container 1. Since the processing gas is supplied from the gas ring 7 to a region where an electron temperature of plasma is low (plasma dispersion region), an excessive dissociation of the processing gas may be prevented, thereby obtaining an optimal dissociation state.

The processing gas includes a plasma excitation gas, a CHxFy gas (X and Y are integers equal to or greater than 1), and an oxidizing gas. The plasma excitation gas includes at least one of Ar, He, Ne, Kr, and Xe. The CHxFy gas includes at least one selected from the group consisting of $CH_2F_2$, $CH_3F$, $CHF_2$, and $CHF_3$. The oxidizing gas includes at least one selected from the group consisting of $O_2$, $CO_2$, and CO. The CHxFy gas and the oxidizing gas configure an etching gas. In the etching gas, radicals of a CHF-based gas are deposited on a substrate to form a deposition film. The oxidizing gas such as $O_2$, $CO_2$, and CO is used to remove or adjust carbon component in the deposition film.

Exhaust holes 28 for discharging the processing gas are provided on the bottom of the processing container 1. A plurality of exhaust holes 28 are provided in a circumferential direction at constant intervals in order to obtain an even flow of the gas symmetrically disposed based on a substrate (semiconductor wafer) W on the holding stage 10. An exhaust path 31 in which a pressure adjusting valve 29 as a controller and a vacuum pump 30 as a gas exhaustion unit are interposed is connected to the exhaust hole 28. Accordingly, the pressure in the processing container 1 may be adjusted to a required level.

The dielectric window 2 is provided in a ceiling portion of the processing container 1 to seal an inside of the processing container 1. The dielectric window 2 is formed of a dielectric material such as quartz, ceramic, alumina ($Al_2O_3$), or aluminum nitride (AlN), and has a transmittance with respect to a microwave. A convex portion 2a protruding toward the inside of the processing container 1 is formed on a lower surface of the dielectric window 2. By forming the convex portion 2a, a microwave may be incident to be inclined with respect to the plasma region, and thus, resonance absorption may occur throughout a wide pressure range from high-degree vacuum to low-degree vacuum. Thus, high density plasma ranging from the high-degree vacuum to the low-degree vacuum can be generated.

An RLSA 4 generating microwave plasma is configured as follows. The RLSA 4 generating plasma in the processing container 1 as a microwave introduction unit is provided on an upper surface of the dielectric window 2. The RLSA 4 includes a slot plate 3 formed of a conductive material and a dielectric plate 5 formed as a disc provided on an upper surface of the slot plate 3. A diameter of the slot plate 3 is greater than that of the semiconductor wafer W. For example, if a size of the semiconductor wafer W is 300 mm, a diameter of the slot plate 3 is about 400 to about 500 mm. A thickness of the slot plate 3 is set to be 1 to a few millimeters.

The slot plate 3 is formed of a copper plate or an aluminum plate having a surface plated with gold. A plurality of slits 3a formed as T-shape and arranged in concentric circles are formed in the slot plate 3, and a microwave is radiated from the plurality of slits 3a into the processing container 1. The arrangement of the slits 3a is not limited to the above example, that is, may be arranged as concentric circles, swirls, or radial shape, for example.

The dielectric plate 5 provided on the upper surface of the slot plate 3 is formed of a dielectric material such as quartz, ceramic, alumina ($Al_2O_3$), or aluminum nitride (AlN). The dielectric plate 5 propagates the microwave introduced from a coaxial waveguide 6 in a radial direction, and at the same time, compresses a wavelength of the microwave. An upper surface and a lower surface of the dielectric plate 5 are covered by conductors. A cooling jacket 8 for cooling the RLSA 4 is provided on an upper portion of the dielectric plate 5. A passage that is connected to a chiller unit (not shown) is formed in the cooling jacket 8. The cooling jacket 8 absorbs heat generated on the dielectric plate 5 and discharges the heat to outside.

The coaxial waveguide 6 introducing the microwave is connected to the dielectric plate 5. The coaxial waveguide 6 is connected to a microwave generator 34 via a mode converter 32 and a rectangular waveguide 33. The microwave generator 34 generates a microwave having a frequency of, for example, 2.45 GHz. The frequency of the microwave is not limited to 2.45 GHz, that is, may be different frequency, for example, 8.35 GHz. Also, an RF power for generating the microwave is set to be 100 W or greater, for example, may be set as 1500 W, 2000 W, 3000 W, and the like. The rectangular waveguide 33 is formed of a rectangular pipe, and propagates the microwave from the microwave generator 34 to the mode converter 32 in a TE mode. The mode converter 32 is to connect the rectangular waveguide 33 to the coaxial waveguide 6, and converts the microwave of the TE mode in the rectangular waveguide 33 into a microwave of a TEM mode in the coaxial waveguide 6. The mode converter 32 is formed as a conical shape toward a lower portion. An upper portion of the mode converter 32 is coupled to the rectangular waveguide 33, and a lower portion of the mode converter 32 is coupled to an internal conductor in the coaxial waveguide 6. The coaxial waveguide 6 extends from the mode converter 32 perpendicularly down to the RLSA 4, and is connected to the slot plate 3. The coaxial waveguide 6 is formed of a dual-structures pipe having an external conductor and the internal conductor. The microwave propagates between the external conductor and the internal conductor in the TEM mode.

The microwave output from the microwave generator 34 is supplied to the RLSA 4 after passing through the rectangular waveguide 33, the mode converter 32, and the coaxial waveguide 6. The microwave is diffused on the dielectric plate 5 of the RLSA 4 in a radial direction, and is radiated into the processing container 1 via the slits 3a of the slot plate 3. Accordingly, the processing gas right under the dielectric window 2 is ionized, and plasma generates in the processing container 1.

Figure 2:
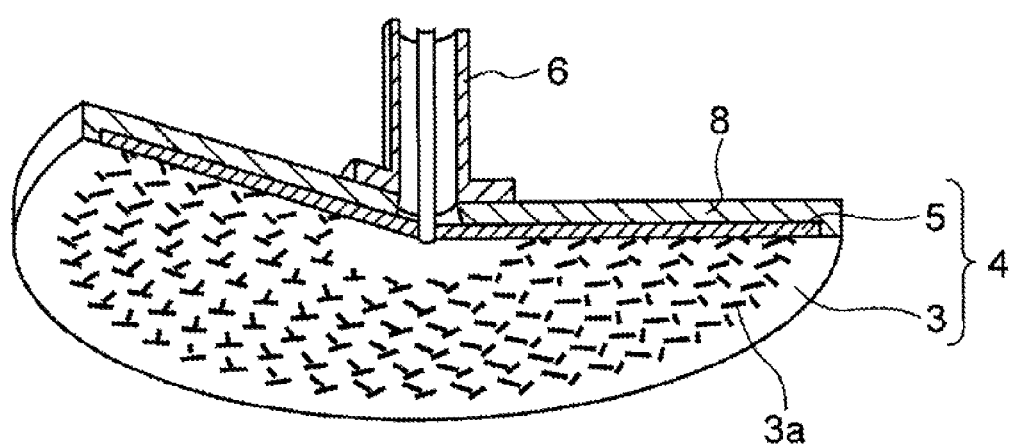
FIG. 2 is a perspective view (including a partial cross-section) showing a pattern of a slit in the RLSA.

FIG. 2 shows an example of a pattern of the plurality of slits of the RLSA 4. The plurality of T-shaped slits 3a is arranged in the slot plate 3 in concentric circles. Each of the slits 3a includes two kinds of single slits, length directions of which are perpendicular to each other. Pitches of the concentric circles in the radial direction are determined based on a wavelength of the microwave that propagates the RLSA 4 in the radial direction. When passing through the slits 3a, the microwave is converted into a plan wave having two polarization components that are perpendicular to each other. The RLSA 4 is advantageous in radiating the microwave evenly into the processing container 1 from an entire region of the antenna, and is suitable for generating uniform plasma under the antenna.

Operation of each of the microwave generator 34, the RF power source 16 for the bias, the DC power source 15, the heater power source 13, the gas supply source 24, and the exhaust pump 29 and overall operations thereof are controlled by a controller 36. The controller 36 may include, for example, a micro computer. A program for setting operations of each component and overall operations is recorded in a recording medium 37 such as a hard disk drive (HDD), a semiconductor memory, or a compact disk (CD).

The controller 36 includes a recipe setting unit for setting a flow rate of the processing gas, a pressure in the processing container, a microwave power of the microwave generator 34, and an RF power of the holding stage 10. Various values set by the recipe setting unit are recorded in the recording medium 37 such as the HDD, the semiconductor memory, or the CD.

An RLSA etching apparatus is characterized in that a low electron temperature and high density plasma may be generated in a region where an etching process is performed. As shown in FIG. 3, when the microwave is introduced through the dielectric window 2 on the upper portion of the processing container 1, plasma of a high density is excited in a region ranging from 10 to 50 mm right under the dielectric window 2. As shown in FIG. 4, the plasma on a generation region has high density and relatively high electron temperature; however, since the plasma is carried through diffusion process from the generation region to a region where an etching process is performed, the electron temperature is lowered. Since the semiconductor wafer W is provided in the diffusion region where the electron temperature is sufficiently low, an etching process may be performed with less ion bombardment damage. Likewise, although the electron density is decreased through the diffusion process, high density can be sufficiently maintained even in the diffusion region because the plasma has high density in the generation region. By supplying the processing gas from the gas ring 7 under the dielectric window 2 to the plasma diffusion region, dissociation control of the processing gas can be possible.

An etching method according to a first embodiment and a second embodiment of the present invention is performed by using the RLSA etching apparatus having the above configuration. The etching method according to the first and second embodiments of the present invention is performed as a process included in a method for producing a semiconductor device. As an example of the method for producing the semiconductor device, a method for producing a metal on semiconductor (MOS) transistor will be described below.

Figure 5A:
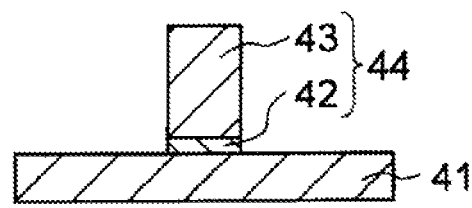
FIGS. 5A through 5G are diagrams describing a method for producing a metal oxide semiconductor (MOS) transistor according to an embodiment of the present invention.

FIGS. 5A through 5G show a method for producing a MOS transistor, in which a 'shallow junction' is formed. First, as shown in FIG. 5A, a device isolation film for surrounding an active region is formed on a silicon substrate 41, and after that, a silicon oxide film 42 is formed on the active region of the silicon substrate 41 as a gate insulating layer by using a thermal oxidation method. Next, a polysilicon film 43 is deposited on the silicon oxide film 42 by using a chemical vapor deposition (CVD) method. Then, the polysilicon film 43 is patterned by using a lithography process and a dry etching process to form a gate electrode 44. Here, the gate insulating film may be formed of a high-K material, and the gate electrode may be formed of metal.

Figure 5B:
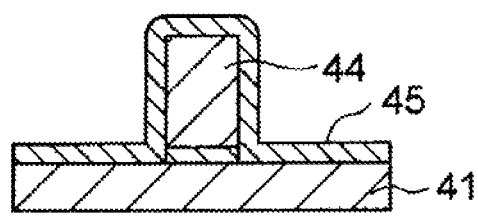

Next, in the process shown in FIG. 5B, a silicon oxide film 45 is formed on a surface of the gate electrode 44 by using, for example, a CVD method.

Figure 5C:
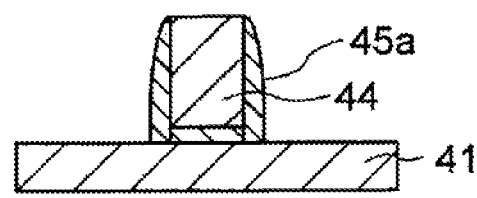

In addition, in the process shown in FIG. 5C, a dry etching is performed until a polysilicon surface of the gate electrode 44 is exposed, and the silicon oxide film 45 corresponding to an upper surface of the gate electrode 44 and an upper surface of the silicon substrate 41 is removed. Accordingly, offset spacers 45a are formed on side walls of the gate electrode 44.

Figure 5D:
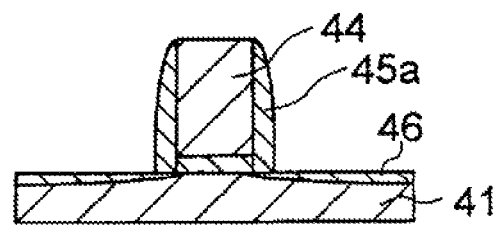

After that, in the process shown in FIG. 5D, impurity ion is injected by using the gate electrode 44 and the offset spacers 45a as a mask to form extension regions 46 on opposite side portions of the gate electrode 44 in the silicon substrate 41. By forming the offset spacers 45a, depth of the extension regions 46 formed into portions right under the gate electrode 44 in the silicon substrate 41 may be shallow.

Figure 5E:
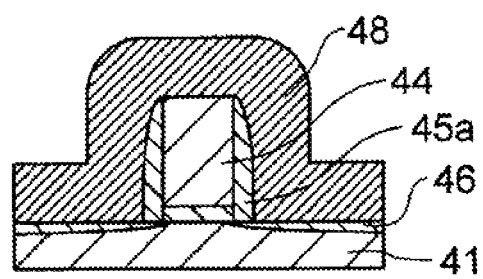
Figure 5F:
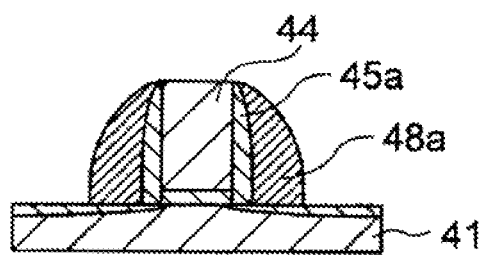

Next, in the process shown in FIG. 5E, a silicon nitride film 48 is formed on the silicon substrate 41 by using the CVD method, and then, the silicon nitride film 48 is etched back to form side wall spacers 48a on side walls of the offset spacers 45a in the process shown in FIG. 5F. After that, ion implantation of impurity ions is performed by using the gate electrode 44, the offset spacers 45a, and the side wall spacers 48a as a mask to form high concentration source/drain regions 50 on outer portions of the extension regions 46.

Figure 5G:
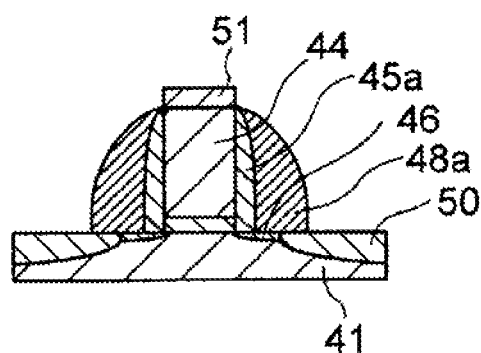

Next, in the process shown in FIG. 5G, a cobalt film is deposited on the silicon substrate 41 by using the CVD method in order to make the cobalt film and the polysilicon react with each other, and then, non-reacted cobalt film is removed by an etching process. After that, a phase conversion of the silicide is performed to form a silicide film 51 on an upper portion of the gate electrode 44, and a silicide film (not shown) is also formed on a surface of the high concentration source/drain regions 50.

As shown in FIGS. 5E to 5F, the method of etching the semiconductor wafer of the first embodiment is used in a process of anisotropic etching the silicon nitride film 48 formed on the gate electrode 44 and the extension regions 46.

Hereinafter, the method of etching the semiconductor wafer according to the first embodiment will be described as follows. FIG. 6 shows processes of FIG. 5E to FIG. 5F. The semiconductor wafer W, in which the silicon nitride film 48 is formed on the silicon substrate 41, is transferred to the RLSA etching apparatus. In the RLSA etching apparatus, the silicon nitride film 48 is etched back to form the side wall spacers 48a on the side surfaces of the offset spacers 45a.

According to the method of etching the semiconductor wafer of the first embodiment, the processing gas in the processing container 1 is exhausted while supplying the processing gas into the processing container 1 to set a pressure in the processing container 1 to a predetermined value, a microwave is applied to the processing gas to generate plasma, and a bias applied to the holding stage 10 on which the semiconductor wafer W is placed in the processing container 1 is set to a predetermined value to etch the silicon nitride film 48.

The processing gas is a mixture gas of a plasma excitation gas, a CHxFy gas, and an oxidizing gas. The plasma excitation gas includes at least one selected from the group consisting of Ar, He, Ne, Kr, and Xe. The CHxFy gas includes at least one selected from the group consisting of $CH_2F_2$, $CH_3F$, $CHF_2$, and $CHF_3$. The oxidizing gas includes at least one selected from the group consisting of $O_2$, $CO_2$, and CO. The CHxFy gas and the oxidizing gas configure an etching gas. In the etching gas, radicals of a CHF-based gas are deposited on the silicon substrate 41 to form a deposition film. The oxidizing gas such as $O_2$, $CO_2$, and CO is used to remove or adjust carbon component in the deposition film.

Figure 7A:
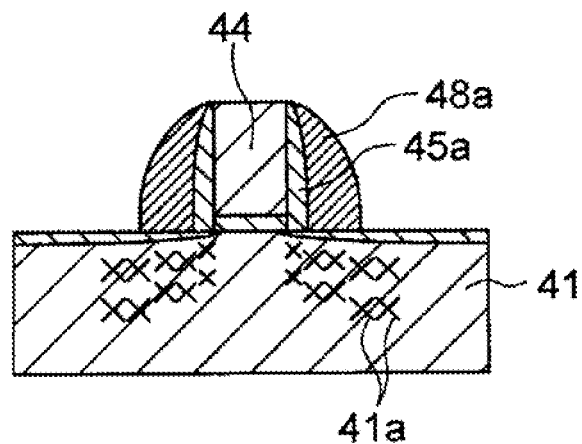

When etching the silicon nitride film 48, selectivity of the silicon nitride film 48 with respect to the silicon substrate 41 has to be improved. As shown in FIG. 7A, if the selectivity is low, damages (recesses) may occur in the silicon substrate 41, thereby degrading of a current drivability of the transistor.

In order to increase the selectivity of the silicon nitride film 48 with respect to the silicon substrate 41, according to the etching method of the first embodiment, a flow rate of the oxidizing gas with respect to the CHxFy gas is set as 4/9 or greater when $O_2$ or $CO_2$ gas is used as the oxidizing gas, and is set as 8/9 or greater when CO gas is used as the oxidizing gas. If a mixture gas in which at least two of $O_2$, $CO_2$, and CO are mixed is used as the oxidizing gas, the flow rate is set to be 4/9 or greater in a converted flow rate to $O_2$. For example, if a flow of the $O_2$ is $\alpha$ and a flow of the CO is $\beta$, a converted flow to $O_2$ is $\alpha+\beta/2$. Likewise, if a flow of the $CO_2$ is $\gamma$ and a flow of the CO is $\beta$, a converted flow to $O_2$ is $\gamma+\beta/2$. If a flow of the $O_2$ is $\alpha$, a flow of the CO is $\beta$, and a flow of the $CO_2$ is $\gamma$, a converted flow to $O_2$ is $\alpha+\beta/2+\gamma$. The flow rate is obtained by dividing the converted flow rate of $O_2$ by a flow rate of the CHxFy gas. It is desirable that the flow rate of the converted flow to $O_2$ is set to be 4/9 or greater.

A flow of the oxidizing gas as a scavenger for removing CF-based deposits is about 1/20 of a flow of the CHxFy gas. When the flow rate of the oxidizing gas with respect to the CHxFy gas is set to be a large value, that is, 4/9 or greater after converting the flow rate of the oxidizing gas into the flow rate of the $O_2$ gas, the oxidizing gas is excessively supplied to etch the surface of the silicon substrate 41 while oxidating the silicon substrate 41. Although it will be described in detail later, by forming a $SiO_2$ film on the surface of the silicon, the surface of the silicon substrate 41 is hardened, and thus, an etching rate of the silicon is lowered. Therefore, the selectivity of the silicon nitride film 48 with respect to the silicon substrate 41 is increased.

However, if the $SiO_2$ film is formed on the surface of the silicon substrate 41, the $SiO_2$ film becomes damages (recesses). Thus, a thickness of the $SiO_2$ film has to be thin. The thickness of the $SiO_2$ film is relevant with ion energy, and thus, the less the ion energy is, the thinner the $SiO_2$ film is. When the RF bias applied to the holding stage 10 is reduced, the ion energy is reduced. Thus, when a diameter of the semiconductor wafer W is 300 mm, an RF bias that is equal to 30 W/($15 \times 15 \times \pi$ $cm^2$) or less per 1 cm of wafer is applied to the holding stage 10. If the diameter of the semiconductor wafer W is 450 mm, an RF bias of 30 W$\times$($22.5 \times 22.5 \times \pi$ $cm^2$)/($15 \times 15 \times \pi$ $cm^2$) or less may be applied.

Figure 7B:
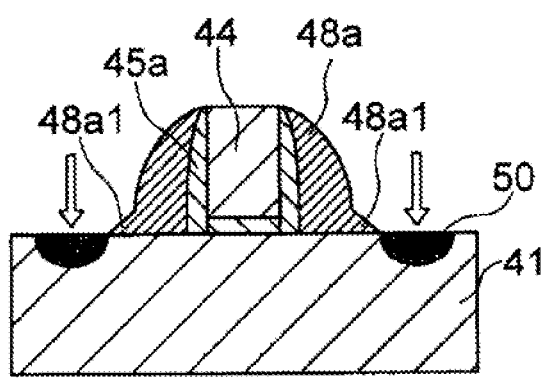

However, when the RF bias is 15 W/($15 \times 15 \times \pi$ $cm^2$) or less, footings 48a1 are formed on the side wall spacers 48a of the silicon nitride film 48 as shown in FIG. 7B. When the footings 48a1 occur, precision of a doping process in a next process is degraded. In order to prevent the footing 48a1, the RF bias of 20 W/(15×15×π cm$^2$) or greater may be applied to the holding stage 10, preferably. Also, in an etching process in which a footing does not occur, the RF bias may be 20 W or less.

Table 1 shows an example of processing conditions in the method of etching the semiconductor wafer according to the first embodiment (when the semiconductor wafer W having a diameter of 300 mm is etched).

TABLE 1

| Processing gas (sccm) | | | Pressure | Microwave | RF bias | Processing |
| --- | --- | --- | --- | --- | --- | --- |
| Ar | CH$_2$F$_2$ | O$_2$ | (mTorr) | power (W) | (W) | time (s) |
| 200~2000 | 45 | 30 | 100 or less | 2000 | 20~30 | 30 |

The method of etching the semiconductor wafer according to the second embodiment is used in a process of removing the side wall spacers 48a formed on the side walls of the gate electrode 44, which are used as a mask, after forming the silicide film 51 on the gate electrode 44 and the surfaces of the source/drain regions 50, in the process shown in FIG. 5G.

The semiconductor wafer W, in which the side wall spacers 48a are formed on the side walls of the gate electrode 44, is transferred to the RLSA etching apparatus. In the RLSA etching apparatus, the side wall spacers 48a formed on the side walls of the gate electrode 44 are etched.

According to the method of etching the semiconductor wafer of the second embodiment, the processing gas in the processing container 1 is exhausted while supplying the processing gas into the processing container 1 to set a pressure in the processing container 1 to a predetermined value, a microwave is applied to the processing gas to generate plasma, and a bias applied to the holding stage 10 on which the semiconductor wafer W is placed in the processing container 1 is set as 0 to selectively etch the silicon nitride film 48.

The processing gas is a mixture gas of a plasma excitation gas, a CHxFy gas, and an oxidizing gas. The plasma excitation gas includes at least one selected from the group consisting of Ar, He, Ne, Kr, and Xe. The CHxFy gas includes at least one selected from the group consisting of CH$_2$F$_2$, CH$_3$F, CHF$_2$, and CHF$_3$. The oxidizing gas includes at least one selected from the group consisting of O$_2$, CO$_2$, and CO. The CHxFy gas and the oxidizing gas configure an etching gas. In the etching gas, radicals of a CHF-based gas are deposited on the silicon substrate 41 to form a deposition film. The oxidizing gas such as O$_2$, CO$_2$, and CO is used to remove or adjust carbon component in the deposition film.

Figure 8:
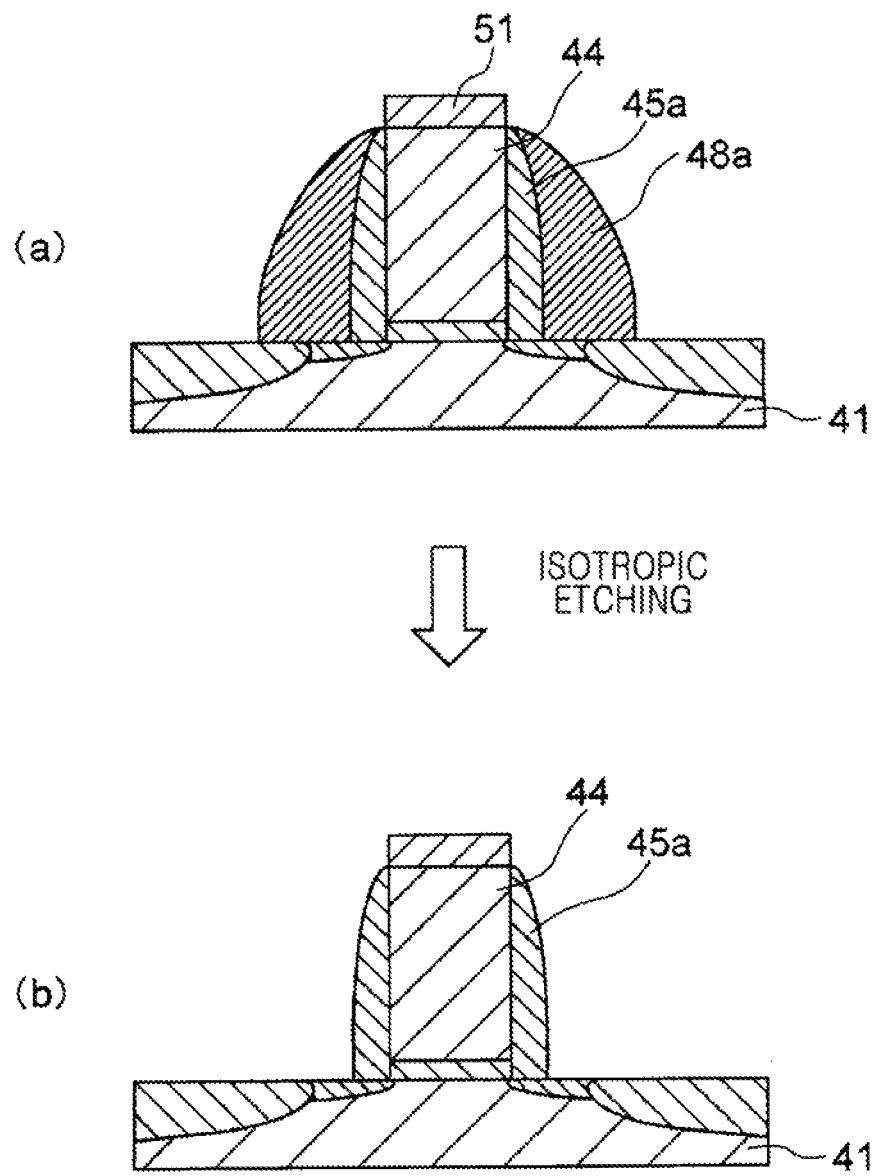
FIGS. 8A and 8B are diagrams showing isotropic etching processes of the side wall spacers in the MOS transistor.

FIG. 8A shows a state before the side wall spacers 48a are removed, and FIG. 8B shows a state after removing the side wall spacers 48a. When etching the side wall spacers 48a formed of SiN on the side walls of the gate electrode 44, the device has to be fabricated as designed without applying damages (recesses) to the base silicon oxide film 45 or the silicide film 51.

Figure 9A:
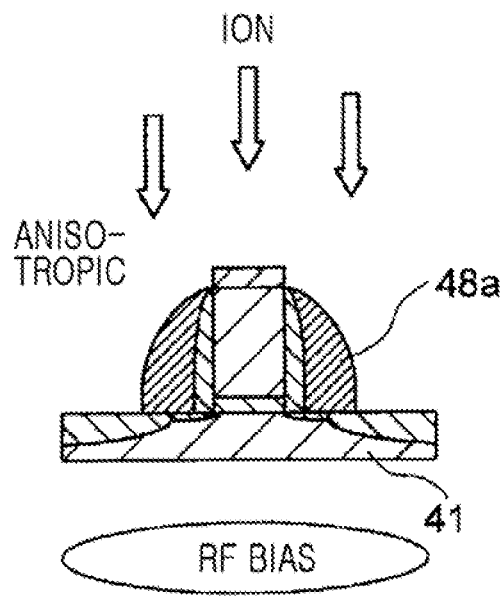

According to the etching method of the present embodiment, a pressure in the processing container 1 in which the microwave plasma is generated is set to be 40.0 Pa (300 mTorr) or greater in order not to generate the damages or recesses in the base silicon oxide film 45 or the silicide film 51, and the side wall spacers 48a are isotropically etched in a state where the RF bias is not applied to the holding stage 10. Since the ions have no directionality when the RF bias is not applied, an isotropic etching can be performed. By setting the pressure in the processing container 1 to be high, that is, 40.0 Pa (300 mTorr) or greater, frequencies of collisions between ions and gas molecules until ions reach the substrate increase, thereby losing its directionality easily. Thus, the isotropic etching can be performed. FIG. 9A shows a comparative example in which the RF bias is applied. When the RF bias is applied, ions are dragged to the silicon substrate 41, thereby generating directionality of ions, that is, anisotropy.

Table 2 shows an example of processing conditions in the method of etching the semiconductor wafer according to the second embodiment (when a wafer W having a diameter of 300 mm is etched).

TABLE 2

| Processing gas (sccm) | | | Pressure | Microwave | RF bias |
| --- | --- | --- | --- | --- | --- |
| Ar | CH$_2$F$_2$ | O$_2$ | (mTorr) | power (W) | (W) |
| 200~1000 | 45 | 30 | 300 or less | 2000 | 0 |

Also, the present invention may be modified variously in consideration of instructions of the invention. Detailed embodiments are also modified variously within a scope of the present invention.

For example, according to the method of etching the semiconductor wafer of the first embodiment, the RLSA etching apparatus is used to generate plasma; however, a parallel plate type etching apparatus, an electron cyclotron resonance (ECR) etching apparatus, and an inductively coupled plasma (ICP) etching apparatus may be used instead of the RLSA etching apparatus.

According to the method of etching the semiconductor wafer of the second embodiment, the RLSA etching apparatus is used to generate plasma; however, another etching apparatus may be used instead of the RLSA etching apparatus provided that the etching apparatus can generate plasma in the processing container by using microwave.

Figure 10A:
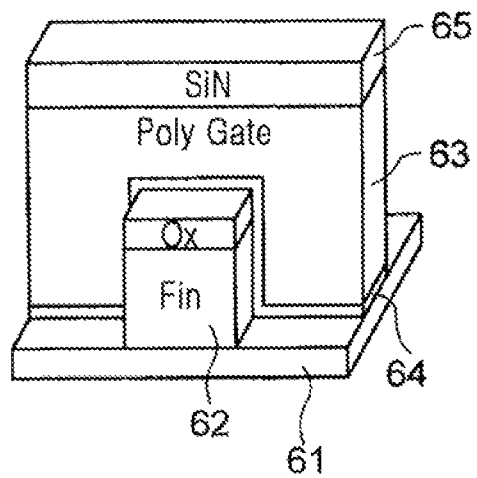
FIGS. 10A through 10C are diagrams describing a method for producing a FinFET.
Figure 10B:
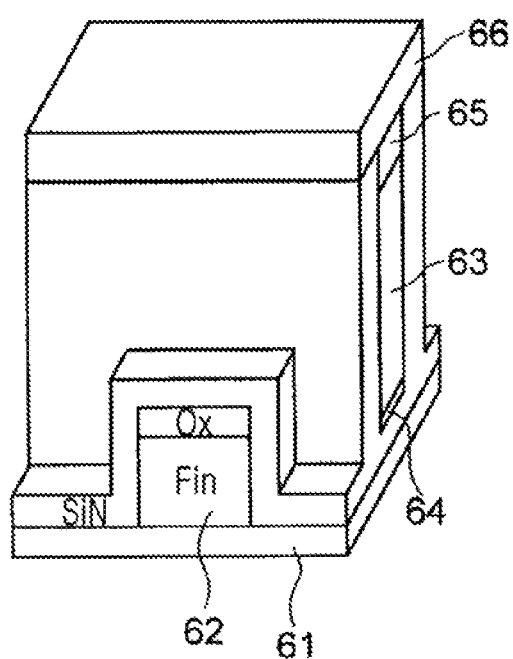
Figure 10C:
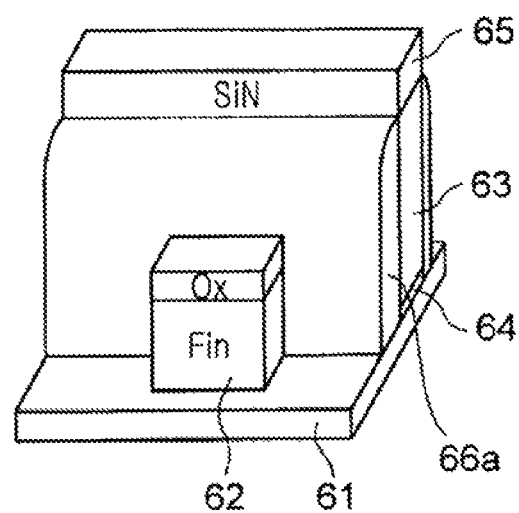

Also, the method of etching the semiconductor wafer according to the first and second embodiments may be applied to an etching of a FinFET that is a metal-oxide semiconductor field-effect-transistor (MOSFET) having a three-dimensional structure. FIGS. 10A through 10C are diagrams showing processes of fabricating a FinFET. As shown in FIG. 10A, a silicon region referred to as a fin 62 is formed on a silicon substrate 61, and a silicon oxide film is formed on a surface of the fin 62. Next, a gate electrode 63 formed of polysilicon is etched by using a silicon nitride film 65 as a mask. The gate electrode 63 is formed over the fin 62, and a side surface of the fin 62 is used as a channel. The gate electrode 63 is formed on the silicon substrate 61 via a gate insulating film 64. Then, as shown in FIG. 10B, a silicon nitride film 66 is formed on upper surfaces of the silicon substrate 61, the fin 62, and the silicon nitride film 65 by using, for example, a CVD method, and is etched back to form spacers 46a on side walls of the gate electrode 63 in the process shown in FIG. 10C.

In processes shown in FIG. 10B and FIG. 10C, anisotropic etching under a condition where selectivity of the silicon nitride film 66 with respect to the silicon substrate and the silicon oxide film is necessary. The method of etching the semiconductor wafer according to the first embodiment of the present invention may be applied to the anisotropic etching process. Also, in the process shown in FIG. 5C, an isotropic etching of the spacers 66a on the side walls of the gate electrode 63 is necessary. The method of etching the semiconductor wafer according to the second embodiment of the present invention may be applied to the isotropic etching process.

The etching method according to the first and second embodiments of the present invention may be applied to methods of fabricating various semiconductor devices, as well as the method for producing the MOSFET.

Embodiment 1

Figure 11:
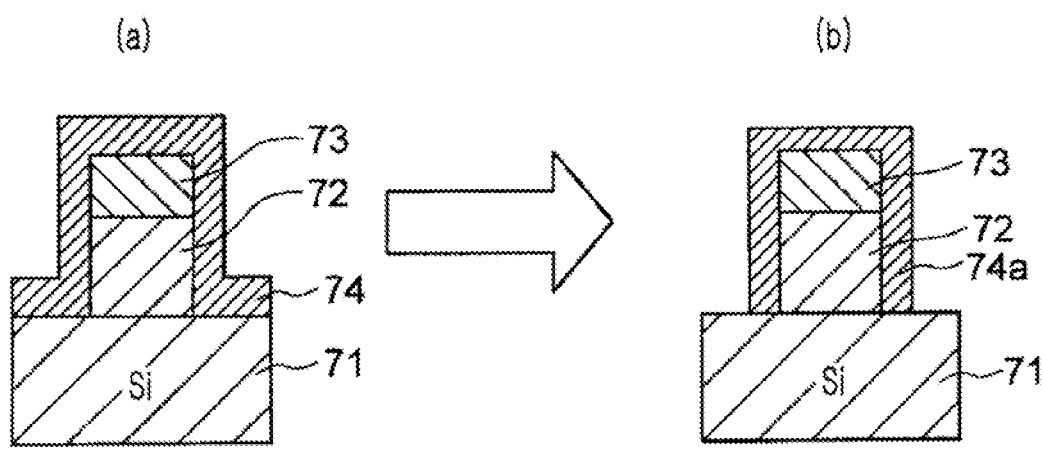
FIGS. 11A and 11B are diagrams showing anisotropic etching processes of a semiconductor device prepared in an embodiment of the present invention.

A semiconductor device shown in FIG. 11A is prepared, and a gate electrode 72 formed of polysilicon is etched by using a silicon nitride film 73 as a hard mask. Next, a silicon nitride film 74 having a thickness of 6 nm is formed on upper surfaces of a silicon substrate 71, the gate electrode 72, and the silicon nitride film 73 by using a CVD method. As shown in FIG. 11B, an anisotropic etching of the silicon nitride film 72 is performed by using the RLSA etching apparatus. Processing conditions of the etching are as follows.

TABLE 3

| Processing gas (sccm) | | | Pressure | Microwave | RF bias |
|---|---|---|---|---|---|
| Ar | $CH_3F$ | $O_2$ | (mTorr) | power (W) | (W) |
| 1000 | 20 | 13 | 100 | 1800 | 25 |

In addition, a recess in a surface of the silicon 71 is observed with a transmission electron microscope (TEM).

FIG. 12 shows an observation result of the recess. In FIG. 12, 'initial' represent a recess before etching, ME represents the recess after a main etching process, and 50% OE represents the recess after 50% over etching. Numbers in parentheses in a column of recess denote a depth of the recess, and numbers marked with Δ denote an increased amount of the recess after the etching. The increased amount of the recess was 1 nm or less even when the 50% over-etching was performed. The increased amount of the recess is far below a tolerable value in a semiconductor device. Footing did not occur due to the 50% over etching.

Figure 13:
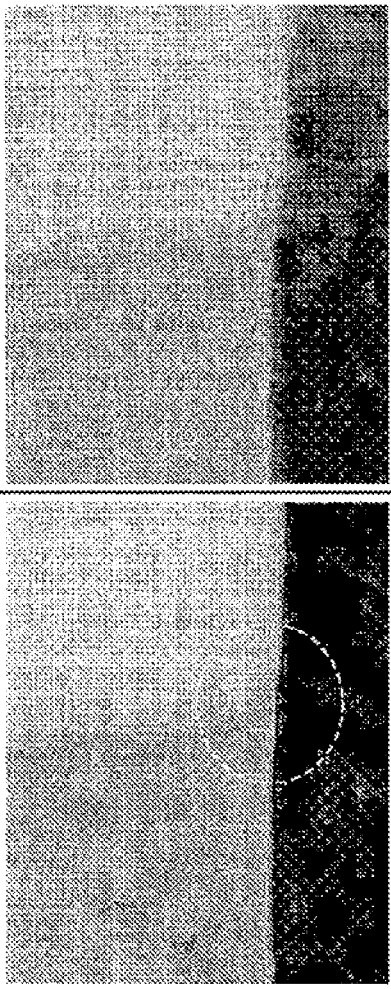
FIG. 13 is a photograph showing an observing result of a recess.

FIG. 13 shows results of observing a recess when the RF bias is changed from 15 W to 25 W. When the RF bias was 15 W, the footing occurred although the recess was small. When the RF bias was 25 W, the footing did not occur. In order to prevent the footing from occurring, the RF bias has to be 20 W or greater.

Embodiment 2

A blanket wafer coated with polysilicon or a silicon nitride film was prepared, and the blanket wafer was etched under various conditions by using an RLSA etching apparatus. Processing conditions of the etching are shown in Table 4.

TABLE 4

| Processing gas (sccm) | | | Pressure | Microwave | RF bias |
|---|---|---|---|---|---|
| Ar | $CH_2F_2$ | $O_2$ | (mTorr) | power (W) | (W) |
| 200~2000 | 45 | variable | 40 | variable | variable |

In addition, an etching rate was measured by using an optical interferometry, and an $O_2$ flow dependency, a microwave power dependency, and an RF power dependency of the etching rate were checked. Also, a surface of the blanket wafer was analyzed by using an XPS.

Figure 14A:
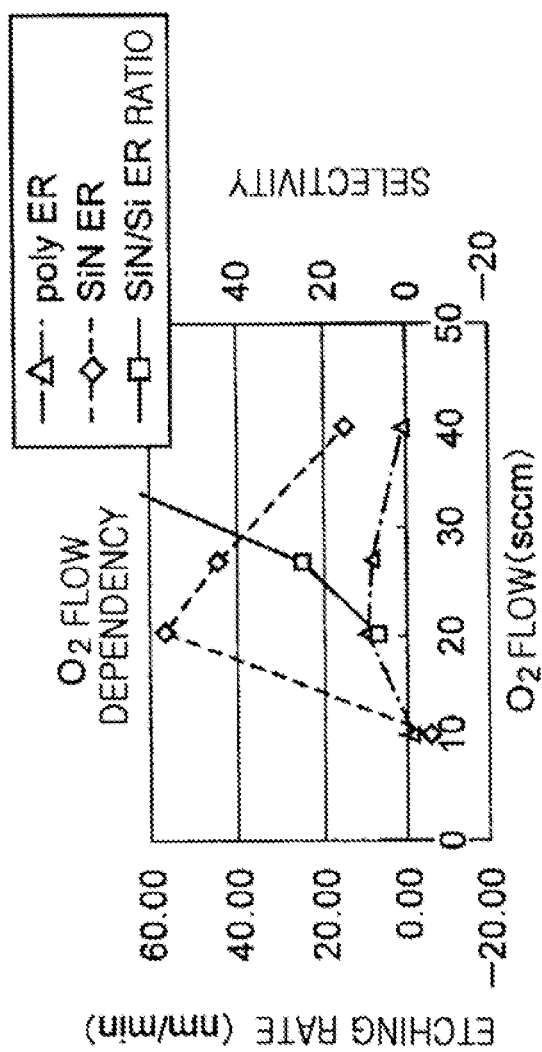
Figure 14B:
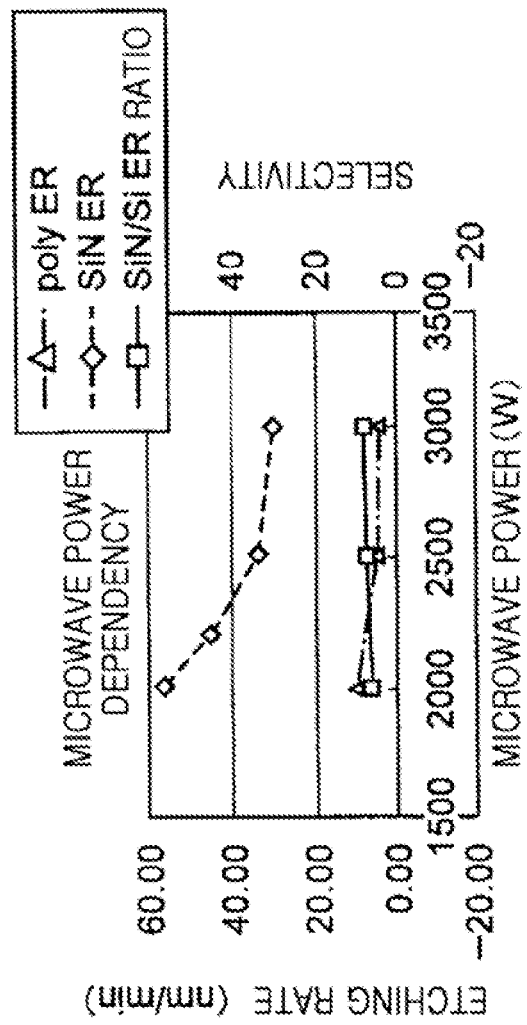
Figure 14C:
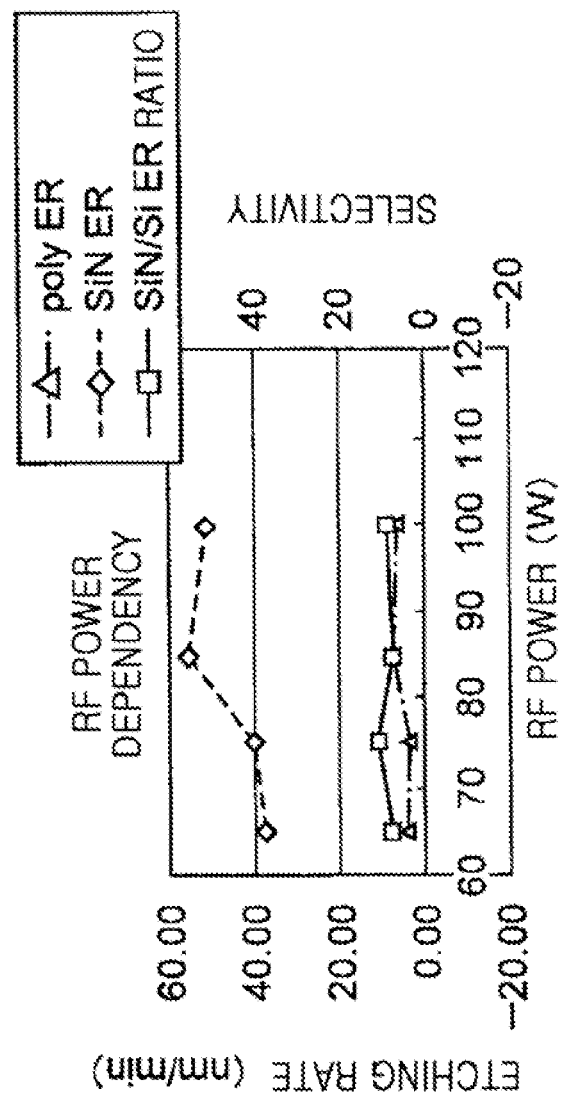

FIG. 14A shows the $O_2$ flow dependency of the etching rate. When the flow of the $O_2$ gas was increased to 20 sccm or more, the selectivity of the silicon nitride film with respect to the silicon was rapidly increased. The flow rate of the $O_2$ gas with respect to the $CH_2F_2$ gas was 20/45=4/9 at that time. When the flow of the $O_2$ gas was increased to 30 sccm or more, the selectivity was large, that is, about 40. When increasing the flow of the $O_2$ gas, the etching rate of the silicon nitride film and the etching rate of the silicon are decreased. However, since a reduction ratio of the etching rate of the silicon is greater than that of the etching rate of the silicon nitride film, the etching rate increases. On the other hand, as shown in FIG. 14B, the etching rate did not depend on the microwave power or the RF power.

Figure 15:
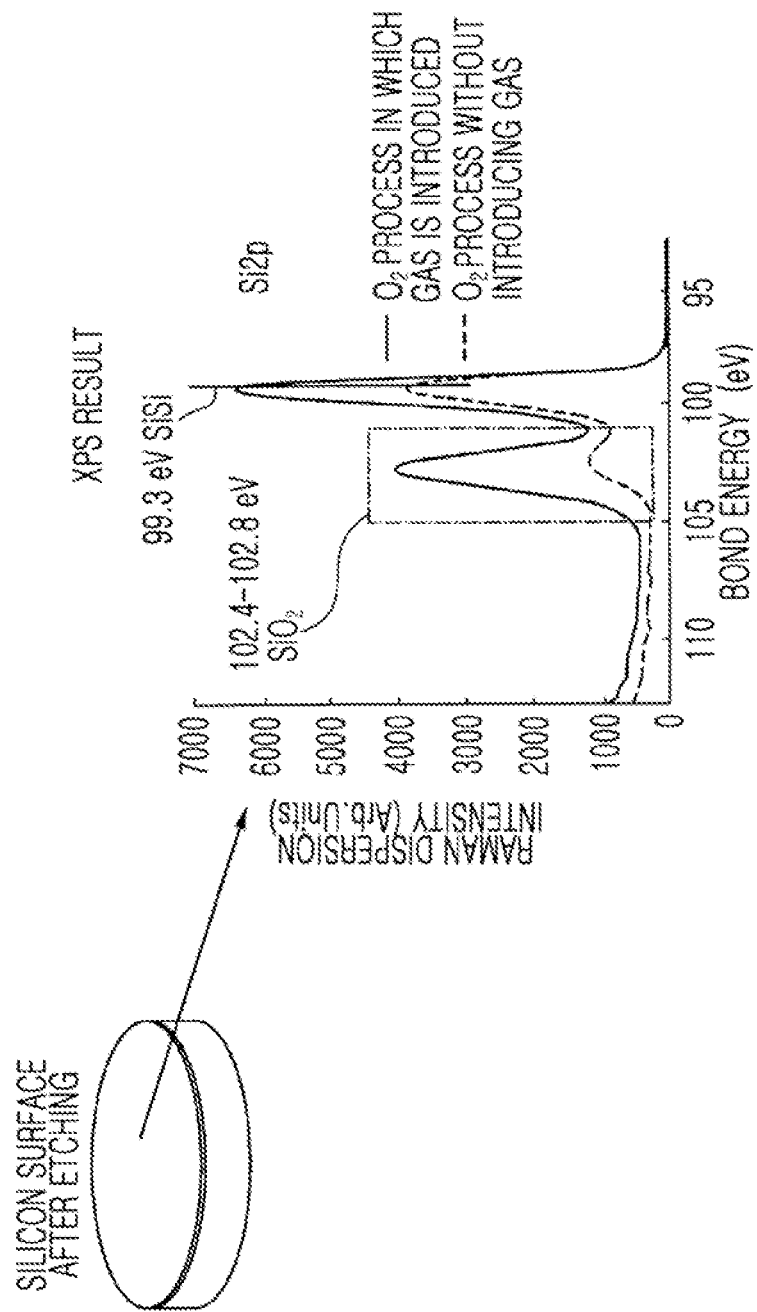
FIG. 15 is a graph showing an XPS analysis result on a silicon surface after the etching.
Figure 16:
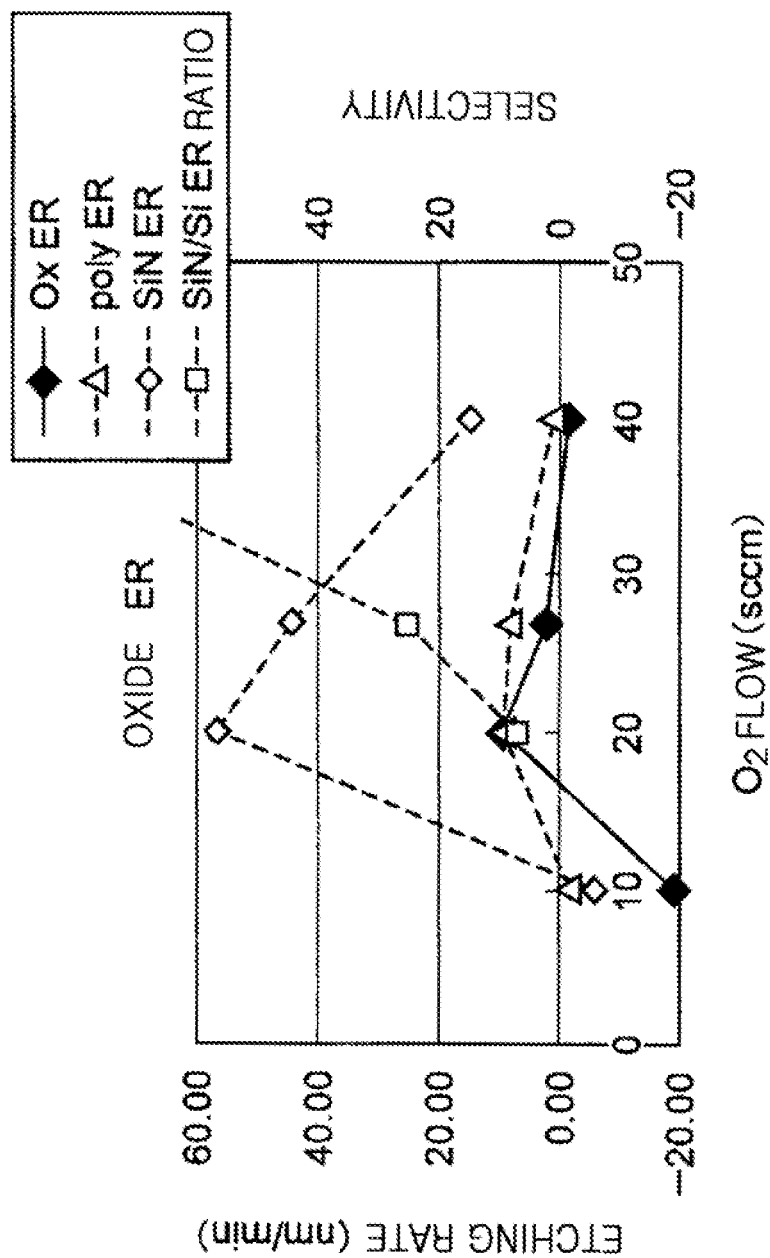
FIG. 16 is a graph showing a relationship between $O_2$ flow and an etching rate of a silicon oxide film.

In order to investigate a reason of the increase in the etching rate when the flow of the $O_2$ gas is increased, the surface of the silicon substrate after the etching process was analyzed by the XPS. FIG. 15 shows a result of the XPS analysis. As shown in the result of the analysis, when the flow of the $O_2$ gas is increased to 20 sccm or more, the surface of the silicon substrate is coated with a $SiO_2$ film. That is, the surface of the silicon is oxidized by the $SiO_2$, and the etching of the silicon nitride film is performed. Bond energies are in a relation of Si—O>Si—N>Si—Si. The oxide film has large bond energy, and is difficult to be etched as shown in FIG. 16. Although the bond energy between the silicon is small, it is presumed that the silicon is oxidized and becomes difficult to be etched, thereby increasing the selectivity.

According to the conventional etching method, the $O_2$ gas is added to the processing gas to remove carbon component in the CF-based deposits. Thus, the flow rate of the $O_2$ gas with respect to the CHxFy gas is set as about 1/20. However, according to the etching method of the embodiments of the present invention, the $O_2$ gas is excessively supplied to oxide the surface of the silicon, as well as to remove the CF-based deposits.

Figure 17A:
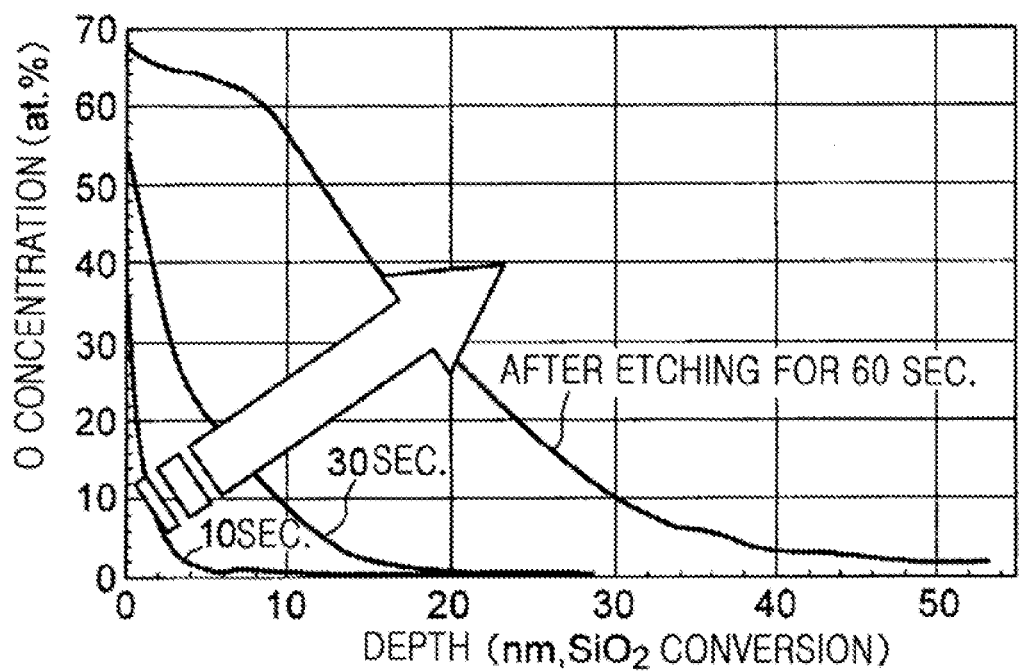
Figure 17B:
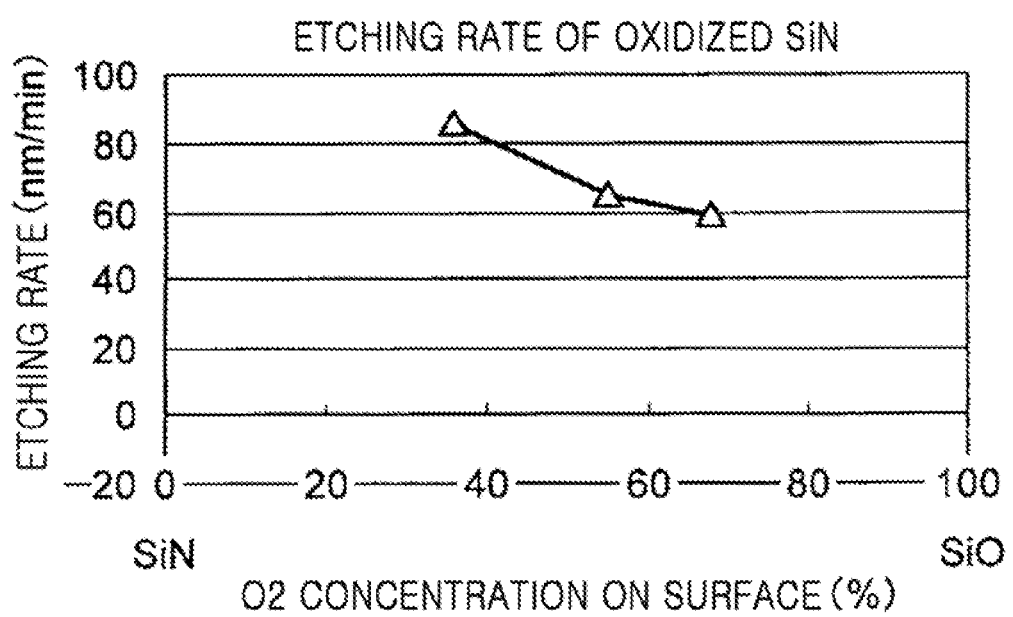

As shown in FIG. 14A, when the flow of the $O_2$ gas is increased, the etching rate of the silicon nitride film is reduced. Thus, the surface of the silicon nitride film was XPS analyzed in order to investigate whether the silicon nitride film is oxidized or not. Then, as shown in FIG. 17A, data representing that the surface of the silicon nitride film was also etched was obtained. As shown in FIG. 17B, when the surface of the silicon nitride film was oxidized, the etching rate of the silicon nitride film was also reduced. However, since the Si is oxidized to SiON, not $SiO_2$, and thus, strength of the film is weak and it is easily etched even when it is oxidized.

Figure 18:
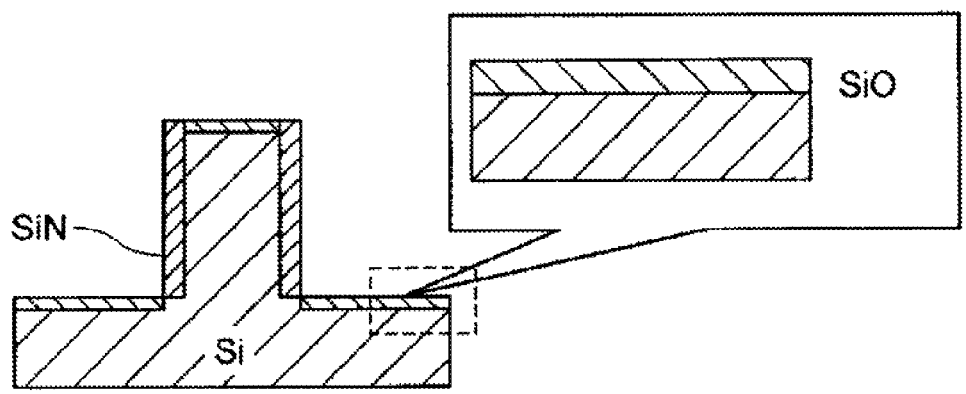
FIG. 18 is a schematic diagram showing a silicon oxide film formed on a surface of a silicon substrate.
Figure 19:
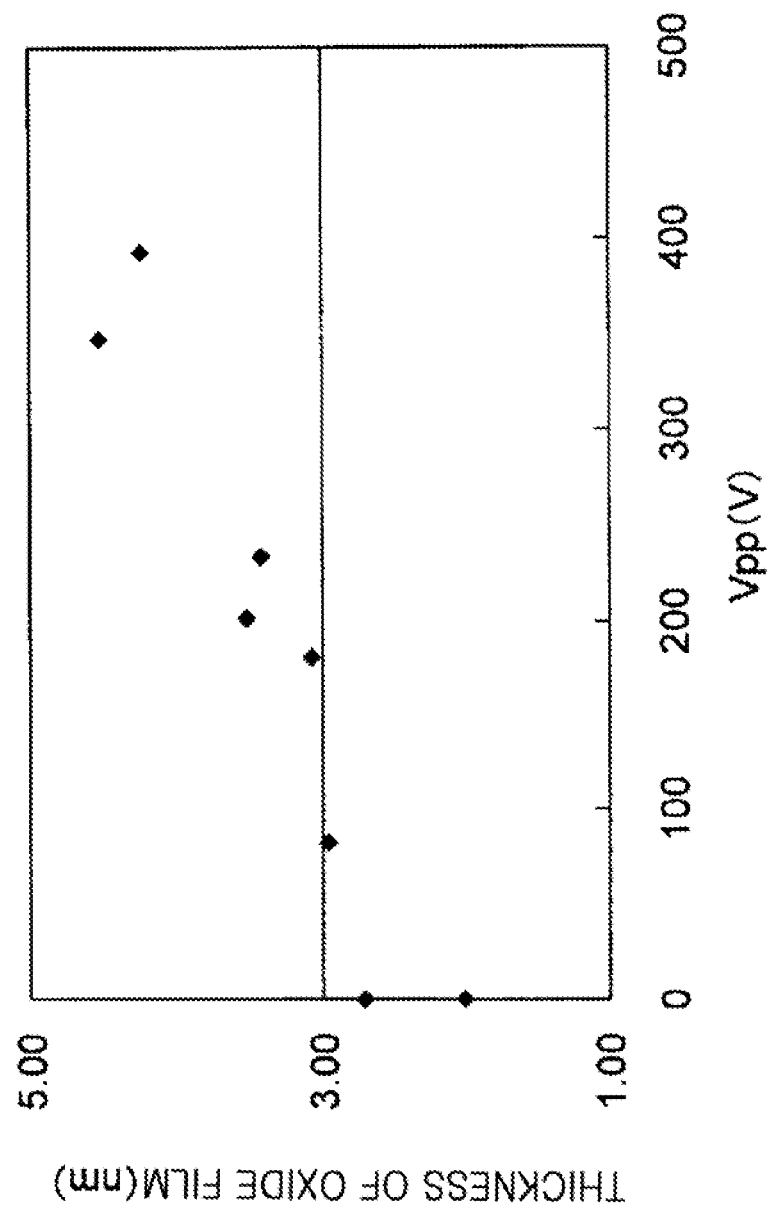
FIG. 19 is a graph showing a relationship between Vpp and a silicon oxide film.

Next, a relationship between ion energy and a thickness of a silicon oxide film formed on a silicon substrate is investigated. As shown in FIG. 18, a silicon oxide film is formed on a surface of a silicon substrate by the $O_2$ gas. The silicon oxide film is counted as a recess. As shown in FIG. 19, the higher Vpp is, that is, the higher the ion energy is, the thicker the thickness of the silicon oxide film is. Thus, it is presumed that the ion energy is restrained at a low level, the thickness of the silicon oxide film may be formed thin. The ion energy has correlation with a sum of an RF bias voltage Vdc and plasma potential. As shown in FIG. 20, the plasma potential may be reduced by using the RLSA etching apparatus when comparing with that of a parallel plate type etching apparatus, and thus, the ion energy may be less than that of the parallel plate type etching apparatus. Thus, it is considered that the thickness of the silicon oxide film may be reduced.

Embodiment 3

Figure 21A:
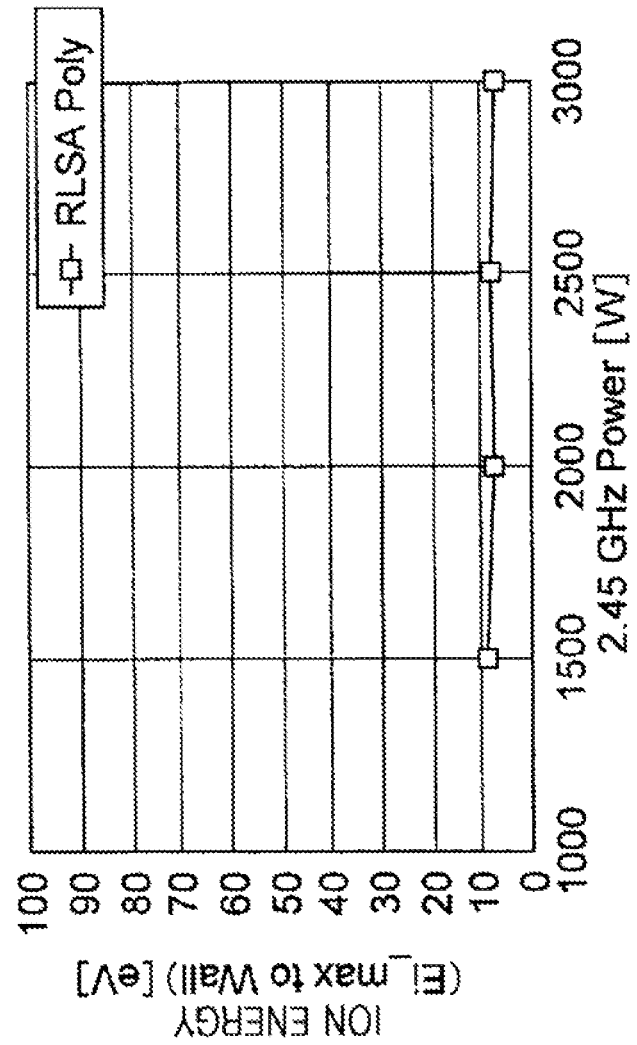
Figure 21B:
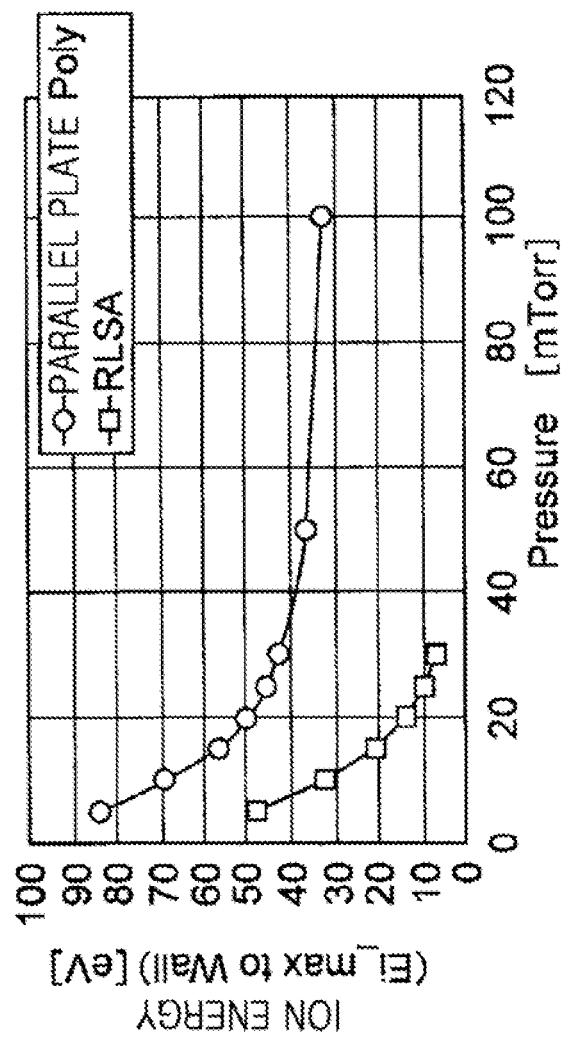
Figure 21C:
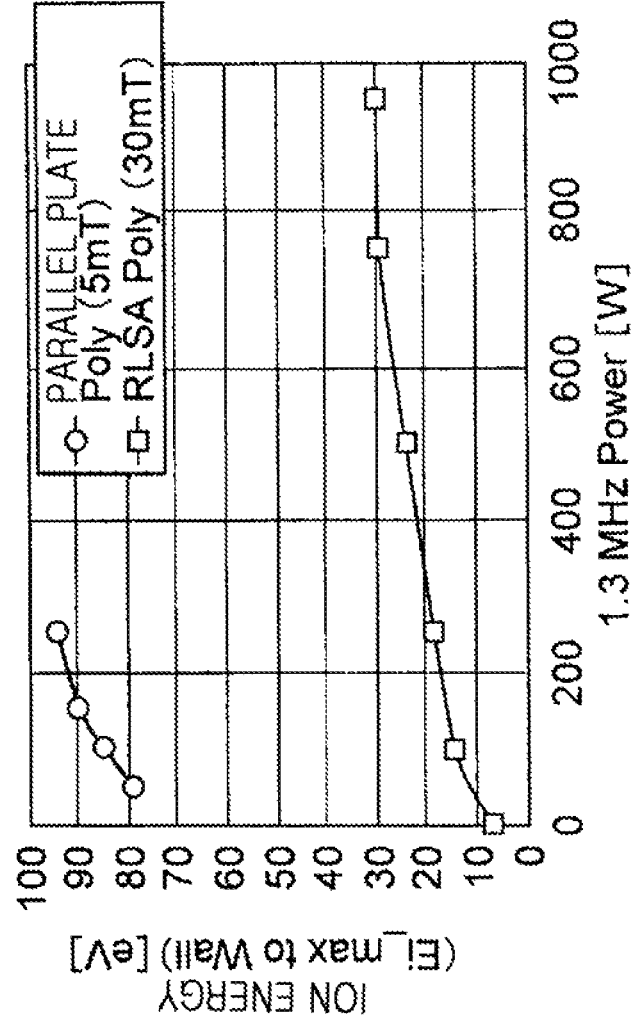

As shown in FIGS. 21A through 21C, plasma potentials in an RLSA etching apparatus (an RLSA etching apparatus for poly-etcher of the present applicant) using the RLSA as a plasma source and in an etching apparatus using parallel plates (parallel plate type etching apparatus for poly-etcher of the present applicant) were compared with each other.

As shown in FIG. 21A, in the RLSA etching apparatus, the ion energy rarely varied even when the microwave power was increased.

As shown in FIG. 21B, in both of the RLSA etching apparatus and the parallel plate type etching apparatus, the ion energy was reduced as the pressure in the processing container 1 was increased. In addition, ion energy of the plasma generated in the RLSA etching apparatus is less than that of the parallel plate type etching apparatus. At a pressure of 30 mTorr, the ion energy in the RLSA etching apparatus was about 7 to 8 eV or less, while the ion energy of the parallel plate type etching apparatus was 40 eV. The ion energy is in proportion to an electron temperature. In the RLSA etching apparatus, the plasma of low electron temperature can be generated. Also, although data of the ion energy when the pressure is 30 mTorr or greater in the RLSA etching apparatus is not shown in the graph of FIG. 21B, the ion energy continuously reduced when the pressure was 30 mTorr or greater.

FIG. 21C shows a variation in the ion energy when the RF bias is applied to the silicon substrate. The ion energy is correlated with a sum of the plasma potential and the RF bias. When the RF bias is not applied, the etching may be performed only by using the plasma potential. In the RLSA etching apparatus, when the RF bias is not applied, the etching may be performed under the low ion energy of about 7 to 8 eV. In the parallel plate type etching apparatus, high ion energy of about 80 eV remains even when the RF bias is 0.

Figure 9B:
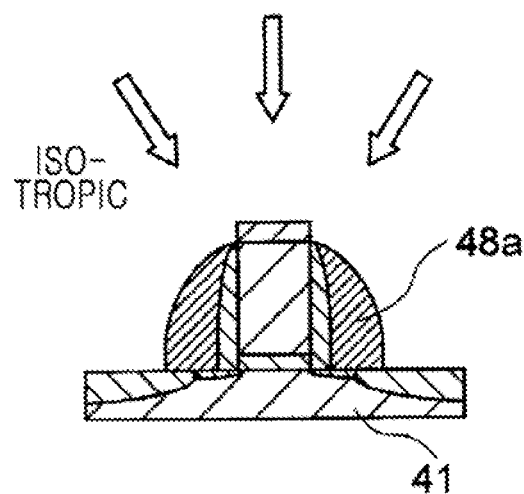

By setting the pressure in the processing container 1 to be high pressure, the isotropic etching shown in FIG. 9B can be performed. Because ions are more likely to collide with the gas molecules until the ions reach the side wall spacers 48a or the silicon substrate 41 in the high pressure environment in comparison with low pressure environment, the directionality of the ions may be removed. When the pressure in the processing container 1 is set as high pressure, the electron temperature is also reduced.

Figure 22:
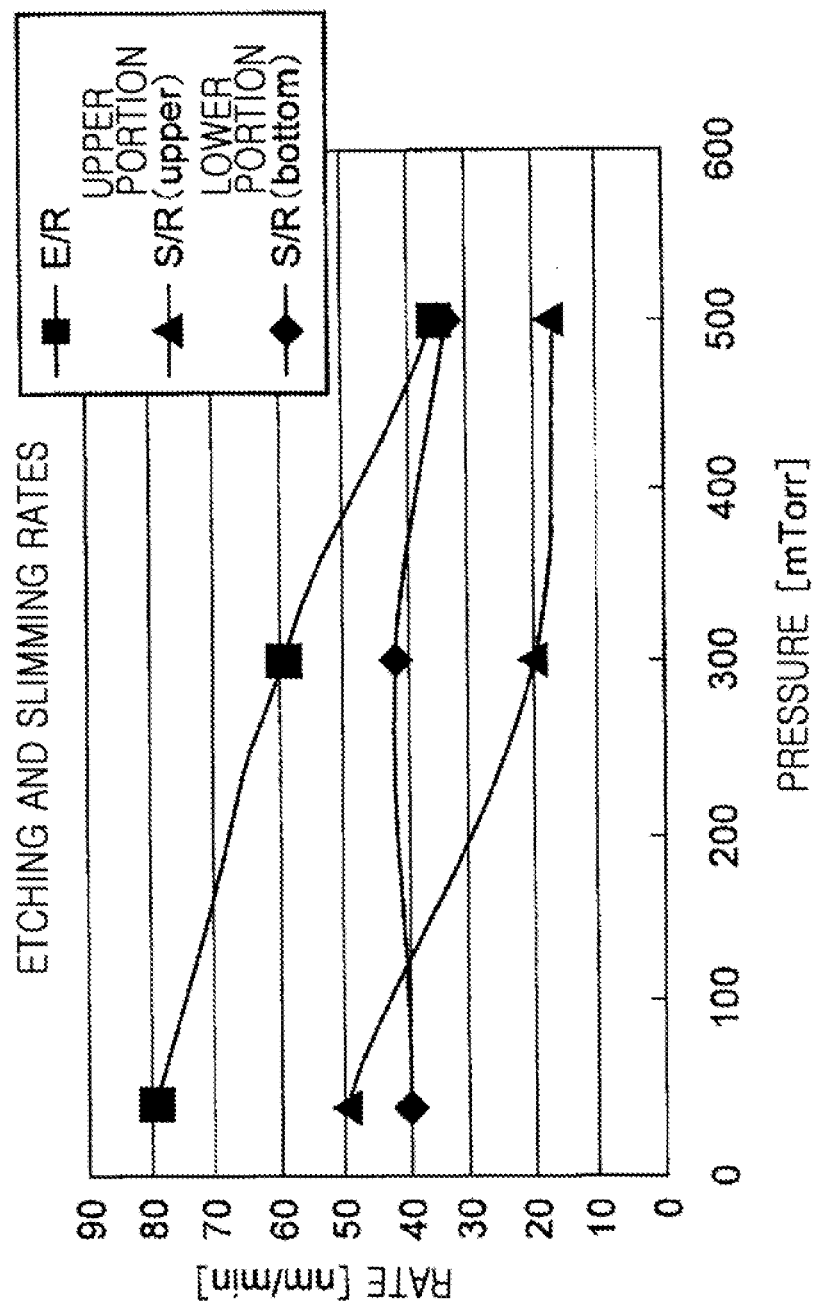
FIG. 22 is a graph showing an etching rate and a slimming rate of a silicon nitride film according to a pressure.

FIG. 22 shows an etching rate (etching speed in a longitudinal direction) and a slimming rate (etching speed in a width direction) of the side wall spacers 48a. The slimming rate is measured at an upper portion and a lower portion of the side wall spacer 48a. When the etching rate is increased, it is easy to etch the side wall spacer 48a in the longitudinal direction, and when the slimming rate is increased, it is easy to etch the side wall spacers 48a in the width direction.

Processing conditions of the etching process (flow of the processing gas, the pressure, the RF power of the microwave, and the RF bias) are shown in Table 5.

TABLE 5

| Processing gas (sccm) | | | Pressure | Microwave RF power | RF bias |
|---|---|---|---|---|---|
| Ar | $O_2$ | $CH_2F_2$ | (mTorr) | (W) | (W) |
| 1000 | 27 | 45 | variable | 2000 | 0 |

In FIG. 22, as the pressure increases from 100 mTorr, the etching rate of the side wall spacer 48a in the longitudinal direction decreases linearly, and is close to the slimming rate when the pressure is 300 mTorr or greater.

Meanwhile, the slimming rate of the side wall spacer 48a in the width direction rarely changes even when the pressure is increased. The slimming rate at the lower portion of the side wall spacer 48a is nearly constant without regard to the pressure, and the slimming rate at the upper portion of the side wall spacer 48a is nearly constant at the pressure of 300 mTorr or greater.

In addition, when the pressure becomes 300 mTorr or greater, the etching rate in the longitudinal direction and the slimming rate in the width direction of the side wall spacer 48a are close to each other, and thus, it is recognized that the isotropic etching can be performed.

Also, in an RLSA etching apparatus of a low pressure specification, the plasma is not stabilized when the pressure is 500 mTorr or greater. Thus, it is desirable that the pressure is set to be 500 mTorr or less.

Figure 23:
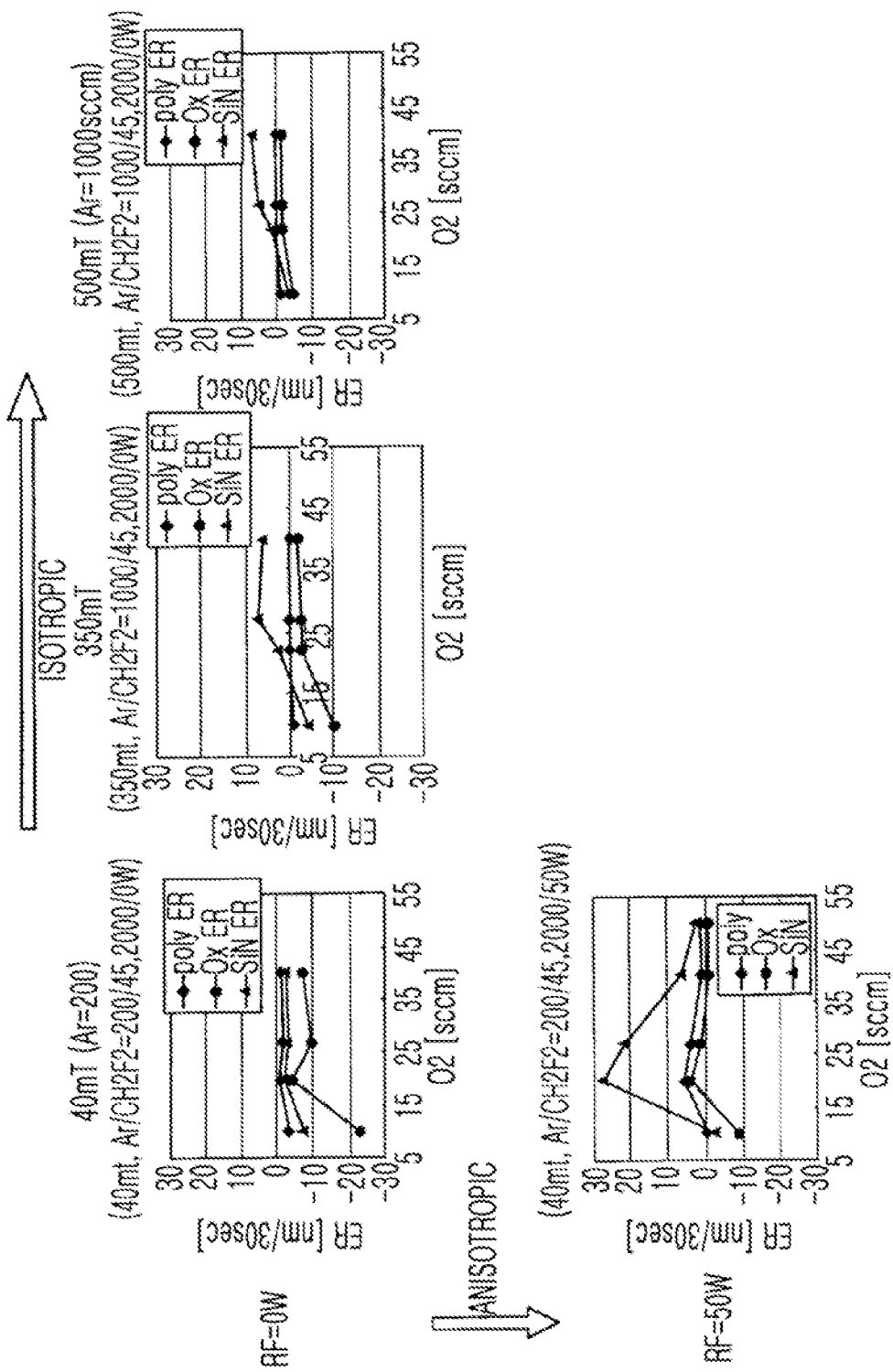
FIG. 23 is a graph showing etching rates of a silicon nitride film, a silicon oxide film, and polysilicon according to a pressure and an RF.
Figure 24A:
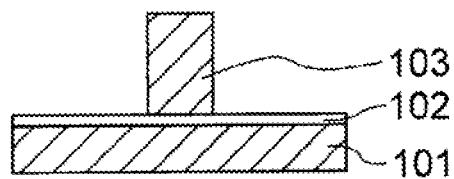
FIGS. 24A through 24E are diagrams describing processes in a producing method of a MOS transistor according to the conventional art.
Figure 24B:
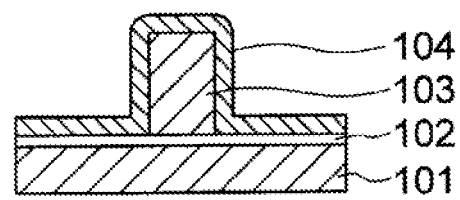
Figure 24C:
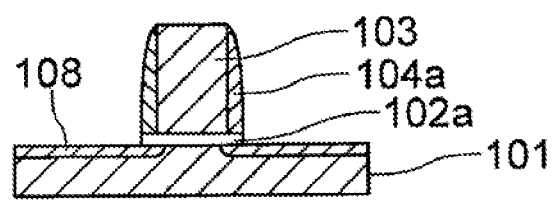
Figure 24D:
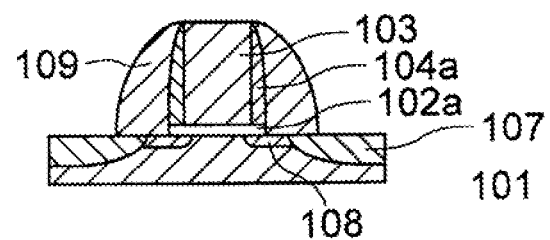
Figure 24E:
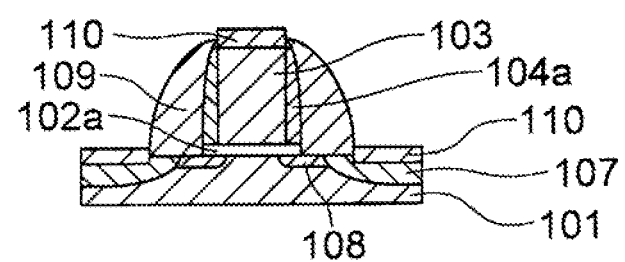

FIG. 23 shows variations in etching rates of the silicon nitride film, the silicon oxide film, and the polysilicon, when the pressure is changed. The kind of used gas, the flow, the RF power of the microwave, and the RF bias are the same as those of Table 5. In FIG. 23, an upper portion shows etching rates when the RF is 0 (W). Since the etching rate is dependent upon the flow of the $O_2$ gas, a transverse axis denotes the flow of the $O_2$ gas.

As shown in the upper portion of FIG. 23, when the pressure is high, that is, 350 mTorr or greater, the etching rate of the silicon nitride film may have a positive value by optimizing the flow of the $O_2$ gas (in more detail, the flow of the $O_2$ gas is 17 to 18 sccm or greater). Meanwhile, the etching rate of the polysilicon or the silicon oxide film is always less than 0, not dependent upon the flow of the $O_2$ gas, that is, the polysilicon or the silicon oxide film is not etched, but a deposition film is formed. That is, the etch selectivity of the silicon nitride film with respect to the silicon oxide film or the polysilicon may be indefinite. Therefore, the silicon nitride film may be only etched without etching the silicon oxide film or the polysilicon. Also, since the etching rate of the silicon nitride film is very small, the silicon nitride film can be adjusted to have a thickness of about 10 nm. In particular, it is suitable for a case where the silicon nitride film remains thin without etching the silicon nitride film.

On the other hand, when the pressure is 40 mTorr, the etching rate of the silicon nitride film is less than 0, as well as the etching rates of the silicon oxide film and the polysilicon (that is, deposition reaction occurs).

A lower portion of FIG. 23 shows etching rates of the silicon nitride film, the silicon oxide film, and the polysilicon when the RF bias of 50 W is applied to the silicon substrate. When the pressure in the processing container 1 is 40 mTorr, as shown in the upper portion of FIG. 23, the silicon nitride film cannot be etched when the RF bias is 0. However, as shown in the lower portion of FIG. 23, when the RF bias of 50 W is applied to the silicon substrate, the silicon nitride film may be etched. When applying the RF bias, it is considered that the ions are infiltrated into the silicon nitride film to react with the silicon nitride film without staying on the surface of the silicon nitride film.

Meanwhile, the etching rates of the silicon oxide film and the polysilicon are nearly 0 even when the RF bias is applied to the silicon substrate. Thus, the selectivity of the silicon nitride film with respect to the silicon oxide film or the polysilicon can be increased by applying the RF bias.

Also, although not shown in FIG. 23, the etching rate of the silicon nitride film with respect to the silicon oxide film or the polysilicon can be increased even when the RF bias increases to 80 W and the pressure increases to 500 mTorr. When the silicon nitride film 48 was etched actually under the RF bias of 80 W or less and the pressure of 500 mTorr or less, recesses including the silicon oxide film 45 or the polysilicon occurring in the gate electrode 44 were reduced, and the shape of the side wall spacer 48a was stabilized.

The invention claimed is:

1. A plasma etching method comprising:
    setting a pressure in a processing container as 300-500 mTorr by supplying a processing gas into the processing container while exhausting the processing gas;
    generating plasma by supplying a microwave to the processing gas; and
    setting a bias applied to a holding stage, on which a substrate is placed, in the processing container to be a predetermined value, to selectively etch a sidewall spacer formed of a silicon nitride film with respect to a base formed of polysilicon while leaving an offset spacer, wherein the selective etching is performed to the substrate having a structure where an electrode is formed on the base, the offset spacer is formed on side walls of the electrode, and the sidewall spacer is formed on side walls of the offset spacer,
    wherein the processing gas includes a plasma excitation gas including at least one of Ar, He, Ne, Kr, and Xe, a CHF-based gas consisting of $CH_2F_2$, and an oxidizing gas consisting of $O_2$, and
    a ratio of a flow rate of the oxidizing gas with respect to a flow rate of the CHF-based gas is set to be 4/9 or greater and 8/9 or less, and the flow rate of the oxidizing gas being 17 sccm or greater such that the oxidizing gas is excessively supplied to be greater than an amount required to remove CF-based deposits, thus, a surface of the base is etched while being oxidized as a silicon oxide film, a surface of the sidewall spacer is etched while being oxidized as a silicon oxynitride film, and a predetermined etching selectivity of the sidewall spacer with respect to the base is obtained due to a difference between an etching rate to the silicon oxide film and an etching rate to the silicon oxynitride film.

2. The plasma etching method of claim 1, wherein a microwave is introduced in the processing container via a dielectric window on an upper portion of the processing container as the external energy, and a radio frequency (RF) of 30 W/(15× 15×π $cm^2$) or less per 1 $cm^2$ of the substrate is applied to a holding stage where the substrate is placed in the processing container.

3. The plasma etching method of claim 1, wherein the plasma etching method is to form spacers formed of a silicon nitride film on side walls of a gate electrode.

4. A method for producing a semiconductor device, the method comprising:
    setting a pressure in a processing container as 300-500 mTorr by supplying a processing gas into the processing container while exhausting the processing gas;
    generating plasma by supplying a microwave to the processing gas; and
    setting a bias applied to a holding stage, on which a substrate is placed, in the processing container to be a predetermined value, to selectively etch a sidewall spacer formed of a silicon nitride film with respect to a base formed of polysilicon while leaving an offset spacer, wherein the selective etching is performed to the substrate having a structure where an electrode is formed on the base, the offset spacer is formed on side walls of the electrode, and the sidewall spacer is formed on side walls of the offset spacer;
    wherein the processing gas includes a plasma excitation gas including at least one of Ar, He, Ne, Kr, and Xe, a CHF-based gas consisting of $CH_2F_2$, and an oxidizing gas consisting of $O_2$, and
    a ratio of a flow rate of the oxidizing gas with respect to a flow rate of the CHF-based gas is set to be 4/9 or greater and 8/9 or less, and the flow rate of the oxidizing gas being 17 sccm or greater such that the oxidizing gas is excessively supplied to be greater than an amount required to remove CF-based deposits, thus, a surface of the base is etched while being oxidized as a silicon oxide film, a surface of the sidewall spacer is etched while being oxidized as a silicon oxynitride film, and a predetermined etching selectivity of the sidewall spacer with respect to the base is obtained due to a difference between an etching rate to the silicon oxide film and an etching rate to the silicon oxynitride film.

\* \* \* \* \*